(12) United States Patent
Ogawa et al.

(10) Patent No.: US 6,219,909 B1
(45) Date of Patent: Apr. 24, 2001

(54) METHOD OF MOUNTING DISK DRIVE APPARATUS

(75) Inventors: Hitoshi Ogawa; Eisaku Saiki; Satoshi Kawamura; Kiyoshi Honda, all of Yokohama; Kazuhisa Shiraishi; Fukashi Ohi, both of Odawara, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/176,689

(22) Filed: Jan. 3, 1994

Related U.S. Application Data

(63) Continuation of application No. 07/799,143, filed on Nov. 27, 1991, now abandoned.

(30) Foreign Application Priority Data

Nov. 28, 1990 (JP) .................................................. 2-331554
Mar. 5, 1991 (JP) .................................................. 3-038385

(51) Int. Cl.[7] ...................................................... H05K 3/34
(52) U.S. Cl. ............................ 29/840; 29/832; 174/52.4; 360/97.01; 360/97.02; 439/65
(58) Field of Search ................... 29/840, 832; 360/97.01, 360/97.02; 174/52.4

(56) References Cited

U.S. PATENT DOCUMENTS

| | | | |
|---|---|---|---|
| 3,546,539 | * 12/1970 | Wilcox, Jr. et al. ............. | 774/265 X |
| 4,035,046 | * 7/1977 | Kloth ................................ | 174/52.4 X |
| 4,573,753 | * 3/1986 | Vogl ................................... | 439/65 |
| 4,639,863 | * 1/1987 | Harrison et al. . | |
| 4,908,715 | * 3/1990 | Krum et al. ...................... | 360/97.02 |
| 4,979,062 | * 12/1990 | Stefansky et al. ............... | 360/97.02 |
| 5,177,671 | * 1/1993 | Atoh ................................. | 174/52.4 X |
| 5,264,975 | 11/1993 | Bajorek et al. . | |

FOREIGN PATENT DOCUMENTS

| | | |
|---|---|---|
| 57-158064 | * 9/1982 | (JP) . |
| 58-3114 | 1/1983 | (JP) . |
| 58-70565 | 4/1983 | (JP) . |
| 58-94189 U | 6/1983 | (JP) . |
| 59-16348 | 1/1984 | (JP) . |
| 59-116965 | 7/1984 | (JP) . |
| 59-144155 | 8/1984 | (JP) . |
| 60-38485 U | 3/1985 | (JP) . |
| 60-46680 U | 4/1985 | (JP) . |
| 60-55089 U | 4/1985 | (JP) . |
| 60-133744 | 7/1985 | (JP) . |
| 60-159596 U | 10/1985 | (JP) . |
| 61-251 U | 1/1986 | (JP) . |
| 61-79890 U | 5/1986 | (JP) . |
| 61-173144 U | 10/1986 | (JP) . |
| 62-52955 | 3/1987 | (JP) . |
| 62-60181 | 3/1987 | (JP) . |

(List continued on next page.)

OTHER PUBLICATIONS

Wescon/86 Conference Record p 26/5/1–5 Nov. 18–20, 1986 Published by Electron, Conventions Manage, a paper by D. Smith (Abstract only).*

Midcon/86 Conference Record, paper No. 8. 1 5 pp Sep. 9–11 1986 Published by Electronics Conventions Management, a paper by D.W. Smith.*

*Primary Examiner*—Carl J. Arbes
(74) *Attorney, Agent, or Firm*—Antonelli, Terry, Stout & Kraus, LLP

(57) ABSTRACT

A disk drive is mounted to a circuit board by directly connecting a disk drive apparatus with a circuit board by using a DIP, PLCC, QFP, or PGA mounting method. The disk drive apparatus has an interface for controlling a disk drive in response to a control signal, a data bus signal and an address bus signal outputted from an information processing unit so that the disk drive apparatus may be connected like a memory card of the information processing unit.

21 Claims, 19 Drawing Sheets

FOREIGN PATENT DOCUMENTS

| | | |
|---|---|---|
| 62-101160 U | 6/1987 | (JP) . |
| 62-161398 U | 10/1987 | (JP) . |
| 62-270089 | 11/1987 | (JP) . |
| 62-256295 * | 11/1987 | (JP) . |
| 63-106035 | 5/1988 | (JP) . |
| 1-61855 U | 4/1989 | (JP) . |
| 1-112586 | 5/1989 | (JP) . |
| 1-72629 U | 5/1989 | (JP) . |
| 1-189091 | 7/1989 | (JP) . |
| 1-292845 | 11/1989 | (JP) . |
| 2-68710 | 3/1990 | (JP) . |
| 2-71470 | 3/1990 | (JP) . |
| 2-110352 U | 9/1990 | (JP) . |
| 2-263382 | 10/1990 | (JP) . |
| 2-302974 | 12/1990 | (JP) . |
| 3-30007 | 2/1991 | (JP) . |
| 3-108178 | 5/1991 | (JP) . |
| 4-44689 | 2/1992 | (JP) . |
| 5-074108 * | 3/1993 | (JP) . |
| 5-65957 | 9/1993 | (JP) . |
| 89-08313 | 9/1989 | (WO) . |

* cited by examiner

| PIN NO | SIGNAL NAME | PIN NO | SIGNAL NAME |
|---|---|---|---|
| 01 | GND | 02 | DB0 |
| 03 | GND | 04 | DB1 |
| 05 | GND | 06 | DB2 |
| 07 | GND | 08 | DB3 |
| 09 | GND | 10 | DB4 |
| 11 | GND | 12 | DB5 |
| 13 | GND | 14 | DB6 |
| 15 | GND | 16 | DB7 |
| 17 | GND | 18 | DBP |
| 19 | GND | 20 | GND |
| 21 | GND | 22 | GND |
| 23 | GND | 24 | GND |
| 25 | OPEN | 26 | TERM PWR |
| 27 | GND | 28 | GND |
| 29 | GND | 30 | GND |
| 31 | GND | 32 | ATN |
| 33 | GND | 34 | GND |
| 35 | GND | 36 | BSY |
| 37 | GND | 38 | ACK |
| 39 | GND | 40 | RST |
| 41 | GND | 42 | MSG |
| 43 | GND | 44 | SEL |
| 45 | GND | 46 | C/D |
| 47 | GND | 48 | REQ |
| 49 | GND | 50 | I/O |

| PIN NO | SIGNAL NAME | PIN NO | SIGNAL NAME |
|---|---|---|---|
| 01 | ATN | 02 | DB0 |
| 03 | BSY | 04 | DB1 |
| 05 | ACK | 06 | DB2 |
| 07 | RST | 08 | DB3 |
| 09 | MSG | 10 | DB4 |
| 11 | SEL | 12 | DB5 |
| 13 | C/D | 14 | DB6 |
| 15 | REQ | 16 | DB7 |
| 17 | I/O | 18 | DBP |

F I G. 23
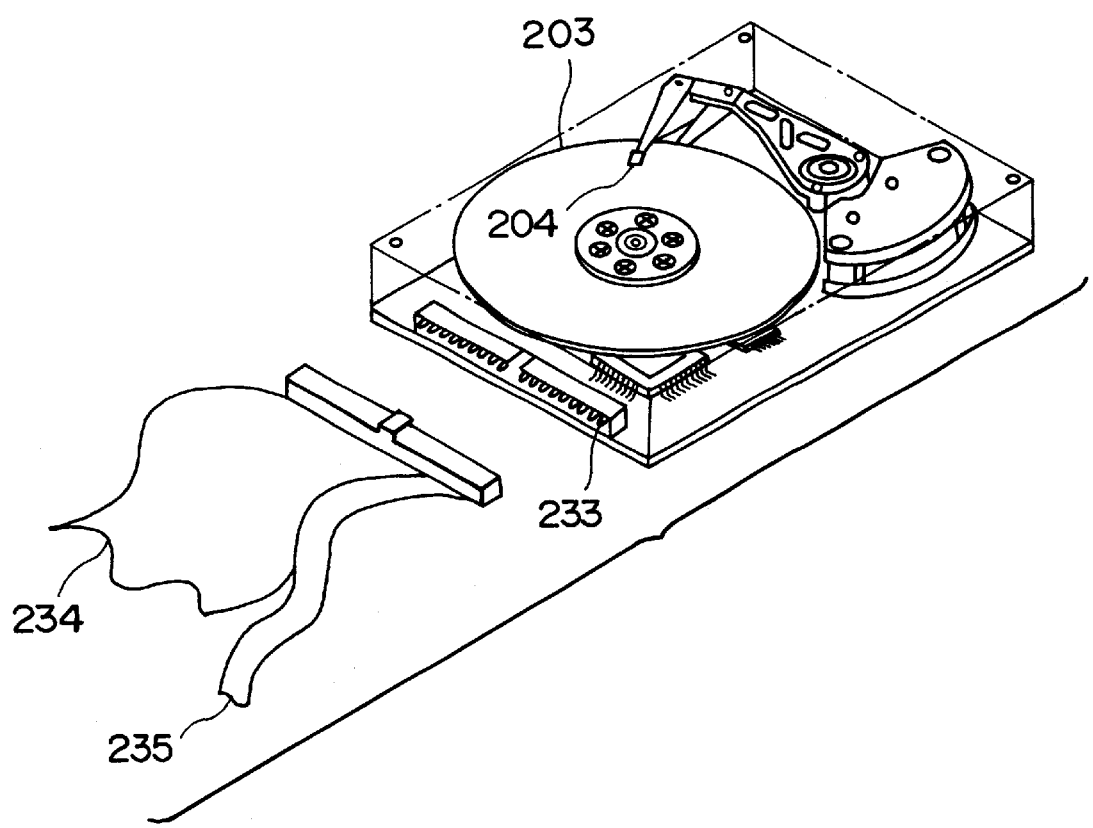

METHOD OF MOUNTING DISK DRIVE APPARATUS

CROSS-REFERENCE TO RELATED APPLICATION

This application is a continuation of application Ser. No. 07/799,143 filed on Nov. 27, 1991, now abandoned.

BACKGROUND OF THE INVENTION

1. Field of the Invention

The present invention relates to a small, high capacity disk drive apparatus with low power consumption and a method of mounting the same.

2. Description of Related Art

As is disclosed in PCT/W089/08313, now U.S. Pat. No. 4,937,785 a related art small magnetic disk drive apparatus comprises one or more magnetic disks which are about 2.5 inches in size. A rotary actuator mechanism, a magnetic head positioning servo mechanism and power saving means are also mentioned therein.

Specifically, the rotary actuator mechanism includes an arm assembly having a cam follower for dynamically loading and unloading the magnetic head.

The servo mechanism enhances the accuracy of head positioning by reducing an external force applied upon the servo actuator and includes hardware and software for saving the consumed electric power.

The other prior art which is disclosed in the Japanese Unexamined Patent Publication No. 62-256295 relates to a light weight and inexpensive disk drive apparatus in which the circuit board functions as the dust cover.

In order to mount the disk drive apparatus within an information processing system, it is necessary to connect the disk drive apparatus with a unit mounted to a printed wiring board or to connect the disk drive apparatus with a power supply. In order to reduce the number of cables in this case, there has been utilized a printed wiring board which is provided with a connector electrically connected with the disk drive apparatus, for connecting to and from the printed wiring board electrical signals inputted and outputted to and from the disk drive apparatus.

The prior art will be described with reference to FIG. 26.

A plurality of disk drive apparatuses 32 are secured to a printed wiring board 31 by screws and the like.

A connector 33 which electrically connects the printed wiring board 31 with a disk drive apparatus 32 is mounted upon the printed wiring board 31 in the vicinity of the disk drive apparatus 32. A cable 36 having a connector from the disk drive apparatus 32 is connected to the connector 33.

A connector 34 for external connection is mounted on the printed wiring board 31 at one end thereof.

The printed wiring board 31 has such an outer dimension that the board can be mounted upon a printed wiring board mounting unit 40.

A connecting printed wiring board 41 is disposed at the rear side of the printed wiring board mounting unit 40.

The connecting printed wiring board 41 is provided with circuits for a power supply and signal circuits and a connector 42 which will be connected with the connector 34 of the printed wiring board .31.

The printed wiring board mounting unit 40 is provided with guiding grooves 43 for guiding and positioning the printed wiring boards 31 so that the printed wiring boards 31 can be positively secured.

This mounts the printed wiring boards 31 to the printed wiring board mounting unit 40 simultaneously with the electrical connection with the connecting printed wiring board 41.

Accordingly, the disk drive apparatus 32 is connected with an external device via the connector 34 and a printed circuit on the printed wiring board 31. A cable which directly connects the external device with the disk drive apparatus 32 is thus not necessary.

Such a prior art is also described in Japanese Unexamined Patent Publication No. 1-12586.

However, the disk drive apparatus in the prior art has not taken into consideration such developments as miniaturization to less than 2.5 inches in size, high density recording, rotational speed of the spindle motor, control method and power supply method. There have been problems in mounting space and power consumption of the disk drive apparatus and the performance of the associated electronic circuit.

The number of cables which connect a group of disk drive apparatuses on the printed wiring board 31 with an external device has been reduced by mounting a plurality of disk drive apparatuses 32 on the same printed wiring board 31 and by connecting each disk drive apparatus 32 with the external device via the connector 34 provided on the printed wiring board 31.

Accordingly, the printed wiring board 31 is merely used for mounting mainly disk drive apparatuses 32.

There is also a problem that the group of the disk drive apparatuses 32 is connected with the printed wiring board 31 via the cable 36 with a connector of the disk drive apparatus 32 and the connector 33 on the printed wiring board 31.

In other words, the connector portion and cable connection occupies a greater area of the mounting board or the disk drive in the prior art even if the disk drive is miniaturized. The miniaturization of the disk drive has not been effective.

Mounting of the disk drive apparatus 32 and an information processing unit including a CPU and memory elements to the same board has not been considered.

SUMMARY OF THE INVENTION

It is an object of the present invention to provide a small disk drive apparatus which is applicable to a small information processing system, such as a note book type personal computer or a palm top personal computer.

It is another object of the present invention to provide a low power consumption small disk drive and a higher performance electronic circuit.

It is a further object of the present invention to provide a high capacity disk drive apparatus.

It is a still further object of the present invention to provide a method of mounting a disk drive apparatus to a printed wiring board in the same manner as electronic components together with the other information processing unit so that the mounting area of the disk drive apparatus is reduced.

It is yet a further object of the present invention to provide a disk drive apparatus which can be used like a memory card.

The present invention was made to accomplish the above mentioned objects. In an aspect of the present invention, there is provided a method of mounting a disk drive apparatus to a circuit board, comprising providing said disk drive apparatus with a connecting unit which is in contact with an external circuit and providing said circuit board with a terminal unit which corresponds to said connecting unit and is electrically connected with said external circuit, and directly connecting said connecting unit with said terminal unit to connect and secure said disk drive apparatus to said circuit board.

It is preferable that connection of the connecting unit with said terminal unit be achieved by a DIP, PLCC, QFP, PGA, microtribeam or multi-contact rotary connection mounting method.

It is preferable that a power supply terminal and a ground terminal which are formed in said connecting unit and said terminal unit be disposed in positions which are in a diagonally opposed relationship.

It is preferable that the connecting unit have a plurality of terminals, the spacing between the terminals being an integer multiple of 0.254 mm.

If the DIP package design is adopted, there is provided a method of mounting a disk drive apparatus in which said connection of said connecting unit with said terminal unit is performed by dual-in-line package mounting method and in which a plurality of disk drive apparatuses are stacked on top of each other by inserting said connecting unit of an upper disk drive apparatus into through-holes provided on the connecting unit of a lower disk drive.

In another aspect of the present invention, there is provided a disk drive mounting socket comprising a socket portion for supporting a disk drive, a lead portion which is connected with said disk drive supported by said socket portion, and a terminal unit which is electrically contacted with said lead portion to connect with circuits on a board.

In this case, it is preferable that the socket have a vibration absorbing member at a portion which contacts with said disk drive apparatus.

In a further aspect of the present invention, there is provided a disk drive apparatus which is connected with an information processing unit, comprising, a disk drive apparatus, means for connecting said disk drive apparatus with said information processing unit, and interface means for controlling said disk drive apparatus in response to a control signal, a data bus signal and an address bus signal which are generated by and inputted from said information processing system via said connecting means.

Furthermore, an information processing apparatus including this disk drive apparatus is provided.

In this case, it is preferable that said connecting means can be connected with a connector of a memory card of the information processing unit.

A disk drive apparatus in which a ground signal line is omitted from signal lines for a standard interface for connection with an external device is provided.

In this case, it is preferable that the signal lines for the interface of the disk drive apparatus includes a control signal line, a data bus and a power supply line.

The forms of the present invention will now be described in more detail.

The present invention adopts a method which is similar to a method of mounting electronic components to a board.

A package design which is used for packaging electronic components such as ICs is adopted as the package design of the disk drive apparatus. The package designs of the electronic components are mainly classified into two package designs such as a DIP package which is pin insertion mounted and a QFP package which is surface mounted.

Both of these two package designs can be used for the disk drive apparatus.

The board on which the disk drive apparatus will be mounted is provided with contact terminals which are printed in a similar manner to the printed wiring on the board.

Electrical connection between a disk drive apparatus with an information processing unit when they are mounted on the same board is enabled by connecting the leads of the disk drive apparatus with the contact terminals on the board.

It is expected that the need to replace the disk drive apparatus will arise after mounting it to the board. In order to fulfill such need, a disk drive apparatus mounting socket is provided between the disk drive apparatus and the board to make it easier to replace the disk drive apparatus after mounting. The mounting socket is comprised of a vibration absorbing member made of an elastomer or the like so that vibrations/impacts applied upon the disk drive apparatus are reduced.

In order to enable a disk drive apparatus to be carried and to be used like a memory card, a disk interface control unit is provided in the disk drive apparatus so that the disk drive apparatus can be operated with the same prior art interface for a card memory.

Operation of the foregoing embodiments will now be described.

Electrical connection to the contact terminals is made possible by using printed wiring on the board which is the same wiring used for connection of the CPU and memory devices since the disk drive apparatus can be mounted to the same board as the CPU and the memory devices.

The disk drive apparatus is provided on the sides thereof with leads for electrical connection with an external device.

The leads of the disk drive apparatus can be contacted with contact terminals on the board without using any cables. Prior art members securing the disk drive apparatus such as screws are eliminated. Portability of the drive disk apparatus is enhanced by using a socket when the disk drive apparatus is mounted to the board. The socket also functions as a vibration absorbing member.

The disk drive apparatus can be used like a memory card by incorporating a disk interface control in the disk drive apparatus to cope with a system bus.

The disk drive apparatus can be mounted on the board like a TTL electronic component since a power supply terminal and a ground terminal are arranged on the DIP leadframe in a diagonal relationship with each other, making it unlikely that miswiring of the power supply line will occur.

Stacking of a disk drive apparatus with other electronic components or a plurality of disk drive apparatuses is made possible by providing the leads of the disk drive apparatus with insertion holes.

An information processing unit can read and write data to and from the disk drive apparatus in response to a control signal, an address signal and a data bus signal similarly to a memory card.

The present invention may take the following forms.

The disk may be about 1.7 inches in outer diameter.

Recording/reproducing system changing means may be provided for changing the frequency of the read/write clock depending upon the data access position of the head. Rotational speed changing the means for changing the rotational speed of the disk may be provided. The head positioning control method may be a servo-surface servo method. The head positioning control method may be a data-surface servo method. The head positioning control method may be the servo-surface servo method at a seeking time and may be the data-surface servo method at a following time. The head positioning control method may be a combination of the servo-surface servo method and the data-surface servo method. A head moving method used for head positioning control may be a rotary moving method or a linear moving method. If the head moving method used for head positioning control is the rotary moving method, a rotary axis of the head may be aligned with the center of rotation of force.

The disk drive apparatus may be about 12 mm, about 73 mm and about 51 mm in height, width and depth, respectively.

One disk of the disk drive apparatus may have a storage capacity of not less than 40 M bytes. The voltage supplied from an external system to the disk drive apparatus may be about 5 volts or alternatively about 3.5 volts.

The means for connecting the disk drive apparatus with an external system such as an information processing system may be provided with a power supply line for supplying power from the external system to the connecting system. The power from the external system may be independently supplied to analog circuits and digital circuits of the disk drive apparatus.

A spindle motor for rotating the disk may have an outer hub type structure and may be an outer wheel rotary type or an inner wheel rotary type. Alternatively, the spindle motor may have an inner hub type structure and may be an outer wheel rotary type or an inner wheel rotary type. Electronic circuits for the connecting means and the interface means may be disposed on the same board. The board may have the function of a member for supporting a spindle motor shaft of the rotating means. A signal connecting unit may be disposed on the board.

The electronic circuit may comprise a read/write signal processing LSI for writing and reading data to and from the disk, a data control LSI for controlling data fed to and from an external system, an actuator control LSI for controlling the positioning of the magnetic head and the rotation of the spindle motor, a microcomputer for managing the control of the whole of the apparatus and RAM/ROM for storing the data.

In order to miniaturize the disk drive apparatus, the board to which a disk control electronic circuit is mounted forms a part of he casing for the disk drive apparatus. The disk control electronic circuit may be disposed in a free space of the disk drive apparatus by mounting the electronic circuit on a film-like board. It will suffice to use a small data recording disk having an outer diameter of about 1.7 inches in order to achieve the miniaturization. Even if the disk is miniaturized, the linear recording density and track density may be increased to provide a high storage capacity. In order to accomplish this, the linear recording density is made as constant as possible and the storage capacity is increased by adopting a constant density recording method in which the writing frequency is changed in the radial direction of the disk. Accordingly, the disk drive apparatus may include recording/reproducing system changing means for changing the read/write clock frequency depending upon the data access position. This may be achieved by changing the rotational speed of the spindle motor for rotating the disk. This rotational speed changing means contributes to a reduction in the power consumption of the disk drive apparatus by reducing or stopping the rotation of the disk when it is unnecessary.

Head positioning control achieves at least 2500 TPI by the servo-surface servo method. Alternatively, the data-surface servo method may be used. The servo-surface servo method and the data-surface servo method may be used on seeking and following, respectively. A combination of the servo-surface servo method and the data-surface servo system may be used. In order to achieve miniaturization and high precision, the head is moved by either the rotary or the linear moving method. A rotary moving method in which a rotary head axis is aligned with the center of the rotation of an applied force may be adopted to enhance the control performance by suppressing the residual vibrations at a following time when the head positioning is controlled by the rotary moving method.

The disk drive apparatus measures about 12 mm, about 73 mm, and about 51 mm in height, width and depth, respectively, so it can be seen that the apparatus is miniaturized. The disk drive apparatus may have a built-in disk and have a storage capacity of not less than 40 M bytes. In order to achieve simplification of the power source of the external system and to provide a disk drive apparatus with a low power consumption, the supplied voltage may be about 5 volts or as low as 3.3 volts. A signal connecting unit which feeds a control signal and a data signal between the external system and the disk drive apparatus may be provided with a power terminal for receiving a voltage supplied from the external system. The electronic control circuit for the disk drive apparatus may be stabilized by supplying power separately to analog and digital circuits.

A spindle motor for rotating the disk may have an outer hub type structure and may be an outer wheel rotary type or an inner wheel rotary type. Alternatively, the spindle motor may have an inner hub type structure and may be an outer wheel rotary type or an inner wheel rotary type. Electronic circuits for the connecting means and interface means may be disposed on the same board. The board may have a function of a supporting member for the spindle motor shaft of the rotating means. A signal connecting unit may be disposed on the board.

The electronic circuit may comprise a read/write signal processing LSI for writing and reading data to and from the disk, a data control LSI for controlling data fed to and from an external system, an actuator control LSI for controlling the positioning of the magnetic head and the rotation of the spindle motor, a microcomputer for managing the control of the entire apparatus and RAM/ROM for storing the data.

Since the disk drive is mounted to a board by the same method used when mounting electronic components to the board in accordance with the present invention, the area of the board which is occupied by the disk drive can be reduced.

Since the disk drive apparatus, CPU and memory devices are mounted on the same board with the disk drive apparatus and the CPU and the like being arranged in a vertical direction, a cable for connecting the disk drive apparatus with the CPU and the memory devices becomes unnecessary so that miniaturization of the information processing unit can be achieved.

The disk drive apparatus is removably mounted to the board by means of a socket. Since the socket is comprised of a vibration absorbing member made of an elastomer or the like, reliability of the information processing system during transportation is improved.

Direct connection and stacking of the disk drive apparatus with other electronic components is made possible.

The disk drive apparatus can be used like a memory card.

If the board on which the electronic disk control circuit is mounted constitutes a part of the casing of the disk drive apparatus or the electronic disk control circuit is disposed in a free space of the disk drive apparatus by mounting the disk control electronic circuit on a film-like board, miniaturization of the disk drive apparatus is achieved and it becomes suitable for incorporation into equipment.

If the disk is made about 1.7 inches in outer diameter and the disk drive apparatus comprises recording/reproducing system changing means for changing the frequency of the read/write clock depending upon the data access position, positioning means having a data-surface servo system for making the track density not less than 2500 TPI and rotational speed changing means for changing the rotational speed of the disk, a very small, high capacity and low power consumption disk drive apparatus which is suitable for incorporation into equipment is provided.

If the positioning control performance is obtained, the positioning control method may be the servo-surface servo method, or the servo-surface servo method at a seeking time and the data-surface servo method at a following time, or alternatively a combination of the servo-surface servo method and the data-surface servo method.

If the rotary moving method in which a drive unit requires less area or the linear moving method in which no offset angle of the head exists and high head positioning performance is readily obtained is adopted as the head moving method, a very small and high capacity disk drive apparatus which is suitable for incorporation into equipment can be provided.

If the rotary moving method in which the rotary axis of the magnetic head is aligned with the center of force is adopted as the head moving method, residual vibration occuring when the head is moved can be remarkably reduced so that enhancement in following accuracy and shortening of access time can be achieved.

Again, a very small and high capacity disk drive apparatus can thus be provided.

If the disk drive apparatus is made about 12 mm in height, the apparatus is made so small that it is easy to incorporate the apparatus into equipment.

If the disk drive apparatus is made about 73 mm in width and about 51 mm in depth, a very small disk drive apparatus which is suitable for incorporation into equipment can be provided.

If the disk drive apparatus includes one disk having a storage capacity of not less than 40 M bytes, a very small disk drive apparatus which is suitable for incorporation into equipment can be provided.

If the voltage supplied from the external system to the disk drive apparatus is between about 5 volts and 3 volts, the disk drive apparatus is suitable for incorporation into equipment since the supplied voltage is generally used in small OA equipment which is battery powered.

If the connecting means for feeding a control signal and a data signal between the external system and the disk drive apparatus is provided with a power terminal for receiving voltage applied from the external system, the space for connection with the external system can be reduced so that the disk drive apparatus is suitable for incorporation into equipment.

If power is separately supplied to analog and digital circuits of the disk drive apparatus from the external system, the performance of the electronic circuit of the disk drive apparatus can be enhanced.

If the spindle motor for rotating the disk has an outer hub type structure or an inner hub type structure, and is of an outer wheel rotary type or an inner wheel rotary type, the rotation of the disk can be stabilized by miniaturization of the spindle motor and an increase in shaft torque.

If the electronic circuits are disposed on the same board as the disk drive apparatus, a saving in space on the electronic circuit board can be achieved and the disk drive apparatus is suitable for incorporation into equipment.

If the board also functions as a support member for the spindle motor shaft, the spindle motor can be miniaturized and the disk drive apparatus becomes suitable for incorporation into equipment.

If the connecting means is disposed on the board, a saving in board space can be achieved and the disk drive apparatus becomes suitable for incorporation into equipment.

The electronic circuit of the disk drive apparatus comprises a read/write signal processing LSI for writing and reading data to and from the disk, a data control LSI for controlling data fed to and from an external system, an actuator control LSI for controlling the positioning of the magnetic head and the rotation of the spindle motor, a microcomputer for managing the control of the entire apparatus and RAM/ROM for storing the data. Accordingly, a saving in space for the electronic circuit can be achieved and the disk drive apparatus is suitable for incorporation into equipment.

BRIEF DESCRIPTION OF THE DRAWINGS

FIG. 23 is a perspective view showing a further embodiment of a disk drive apparatus of the present invention;

DETAILED DESCRIPTION OF PREFERRED EMBODIMENTS

The preferred embodiments of the present invention will be described with reference to the drawings.

The present invention is not limited to only the following embodiments.

Embodiment 1

Figure 1:
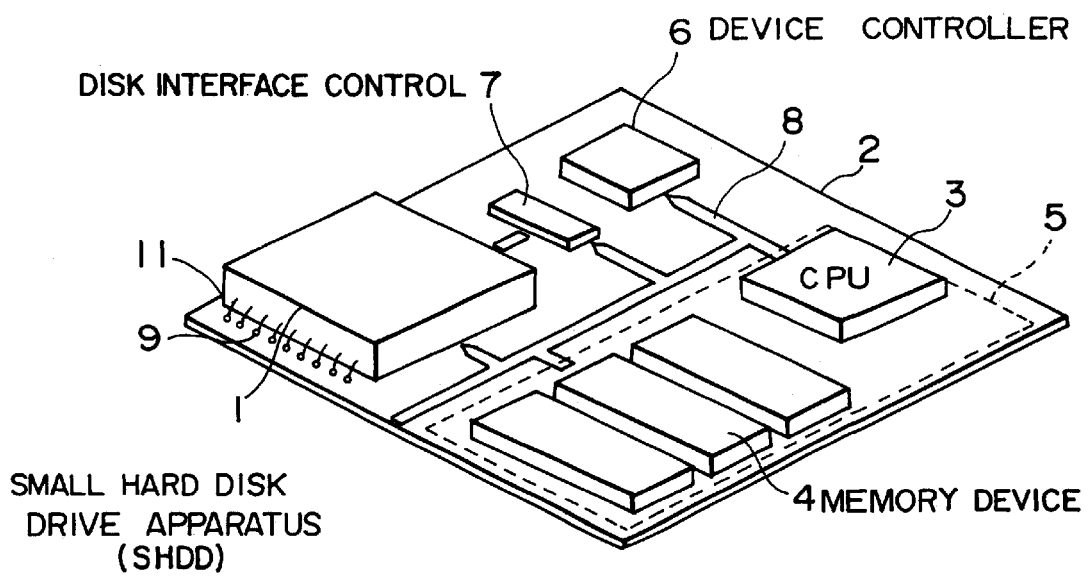
FIG. 1 is a perspective view showing the whole of an embodiment of the present invention.

Referring now to FIG. 1, there is shown a perspective view of an embodiment of a small hard disk drive apparatus (hereinafter referred to as an SHDD) 1 which is mounted on a circuit or printed wiring board 2.

An information processing unit 5 comprising a CPU 3 and memory devices 4, a device controller 6 a disk interface control 7, etc., are formed on the circuit board 2. These components are electrically connected with each other by a bus line 8. In the present embodiment, the SHDD 1 is mounted on the circuit board. In other words, both the information processing unit 5 and the SHDD 1 are provided on the same circuit board.

Contact terminals 9 which are extensions of the bus line 8 are provided on the periphery of the SHDD 1 on the circuit board. On the other hand, leads 11 are provided in positions corresponding to the contact terminals 9. The SHDD 1 is electrically connected with the CPU 3, memory devices 4, etc., via the contact terminals 9 and the leads 11.

Figure 2:
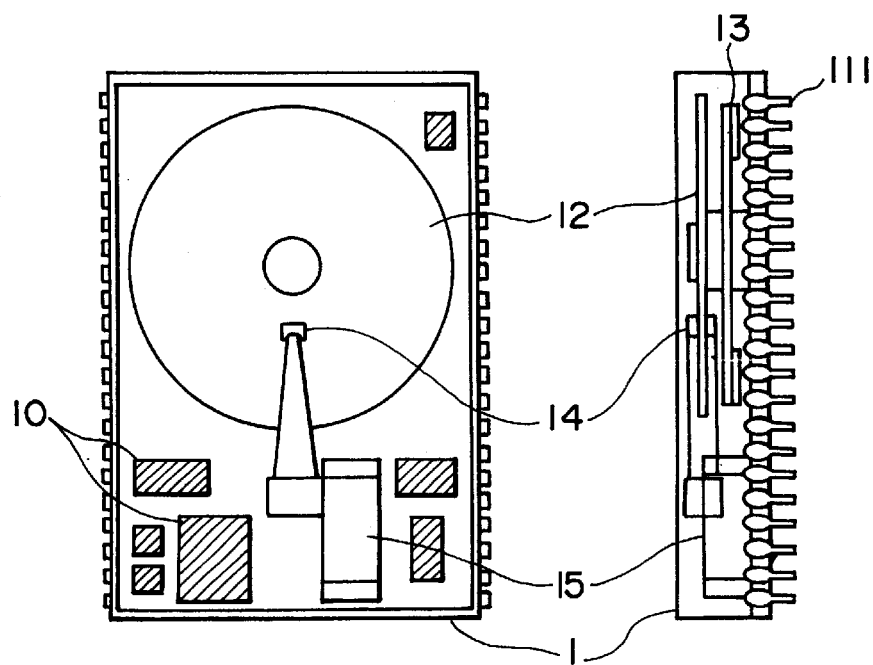
FIG. 2 is a top plan view and an elevational view showing a disk drive apparatus which adopts the DIP leads.

The SHDD 1 and the leads 11 are shown in detail in FIG. 2.

The SHDD 1 includes therein a magnetic disk 12, a magnetic disk rotation control 13, a magnetic head 14, a magnetic head drive control 15 and a disk drive control circuit 10.

The leads 11 are provided on both the right and left sides of the SHDD 1. DIP (dual-in-line package) type leads 111 are adopted as the leads 11 in the present embodiment.

As mentioned above, inputting and outputting from and to the information processing unit 5, etc., is carried out via the DIP type leads 111.

The spacings between the DIP type leads 111 of the present invention are 100 mils (2.54 mm) so that they are equal to those between through-holes of the circuit board 2. Although it is preferable to preset the lead spacing to an integer multiple of 10 mils (0.254 mm), the lead spacing may be preset to a desired pitch without being limited to this value.

Through-holes are provided on the circuit board 2 as contact terminals 9 in positions corresponding to the DIP type leads 111.

Mounting of the SHDD 1 is carried out by inserting the DIP type leads 111 into the through-holes which are the contact terminals 9.

Insertion of the DIP type leads 111 into the through-holes enables the SHDD 1 to be fixed onto the circuit board 2 and to be electrically connected with the information processing unit 5 similarly to conventional DIP type electronic components.

Embodiment 2

Figure 3:
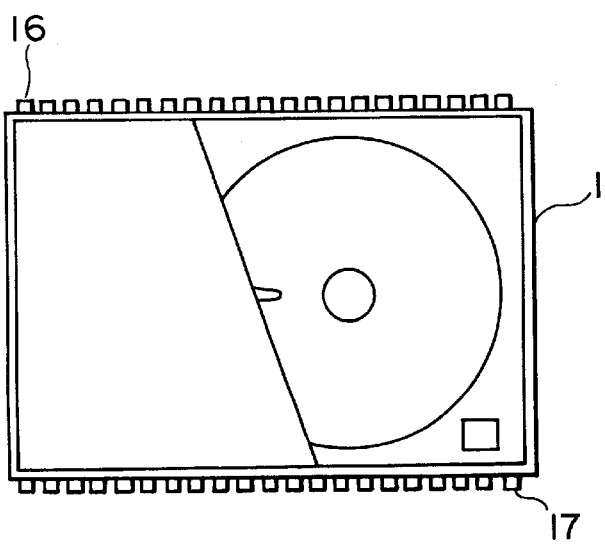
FIG. 3 is a view showing the pin arrangement of the disk drive apparatus which adopts the DIP leads.

The second embodiment is substantially identical with the first embodiment in structure and has a feature that a power source pin 16 and a ground pin 17 are in a diagonally opposed relationship as shown in FIG. 3.

The arrangement of the power source pin and the ground pin has heretofore been uniquely preset in TTL (transistor-transistor logic) devices. The frequency of misconnection occurring when the SHDD 1 is mounted on the circuit board 2 can be reduced by adopting such a pin arrangement with the present invention. Connectors other than the DIP type are also applicable.

Embodiment 3

Figure 4:
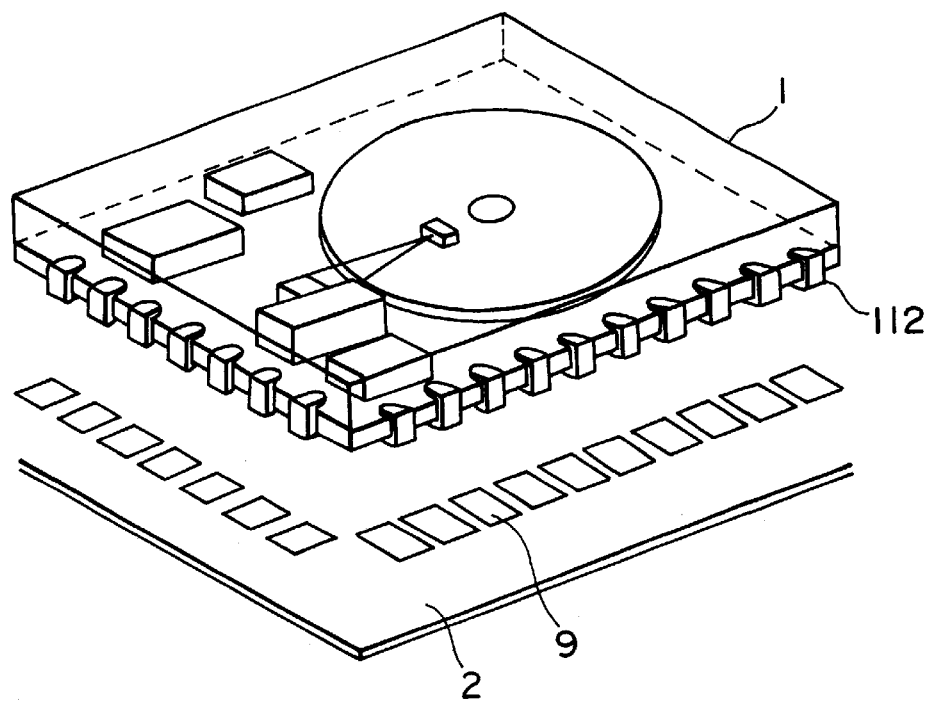
FIG. 4 is a perspective view showing the whole of a disk drive apparatus showing a disk drive apparatus which adopts the PLCC leads.

The third embodiment is substantially identical with the first embodiment in structure and has a feature that PLCC (plastic leaded chip carrier) type leads 112 are adopted as the leads 11 as shown in FIG. 4. The PLCC type leads 112 are provided on the lower surface of the SHDD 1 along the outer periphery thereof.

The SHDD 1 is electrically connected with the information processing unit 5 via the PLCC type leads 112 and the contact terminals 9 on the circuit board 2. The SHDD 1 is mounted on the circuit board 2 by a technique identical with the PLCC mounting technique.

Embodiment 4

Figure 5:
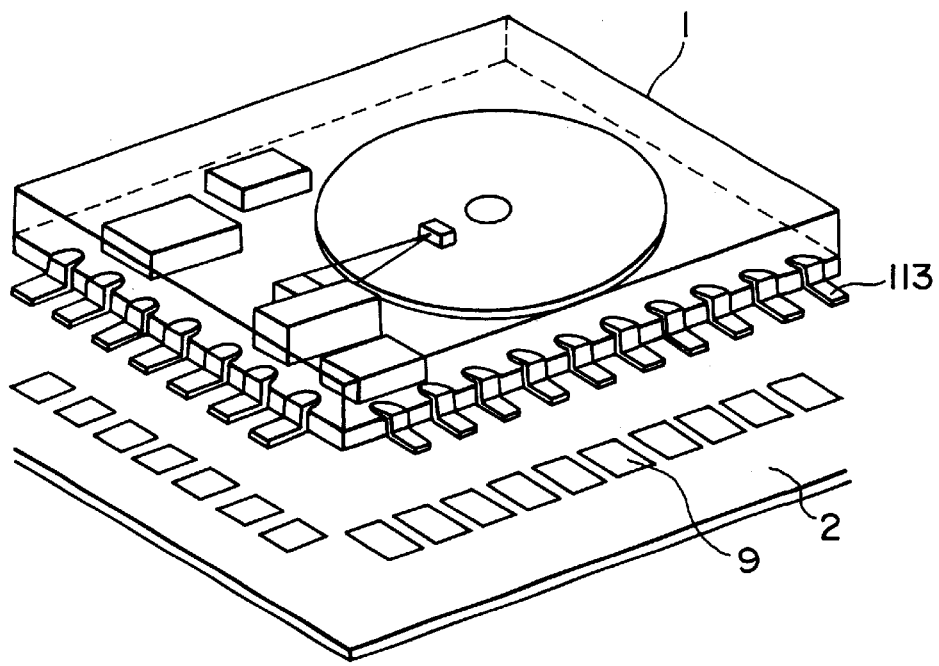
FIG. 5 is a perspective view showing the whole of a disk drive apparatus which adopts the QFP leads.

The present fourth embodiment is substantially identical with the first embodiment in structure and has a feature that QFP type leads 113 are adopted as the leads 11 as shown in FIG. 5. The QFP (quad flat pac) type leads 113 are provided on the lower surface of the SHDD 1 along the outer periphery thereof.

The SHDD 1 of the present embodiment is mounted on and connected with the circuit board 2 by the technique identical with the QFP type mounting technique.

Embodiment 5

Figure 6:
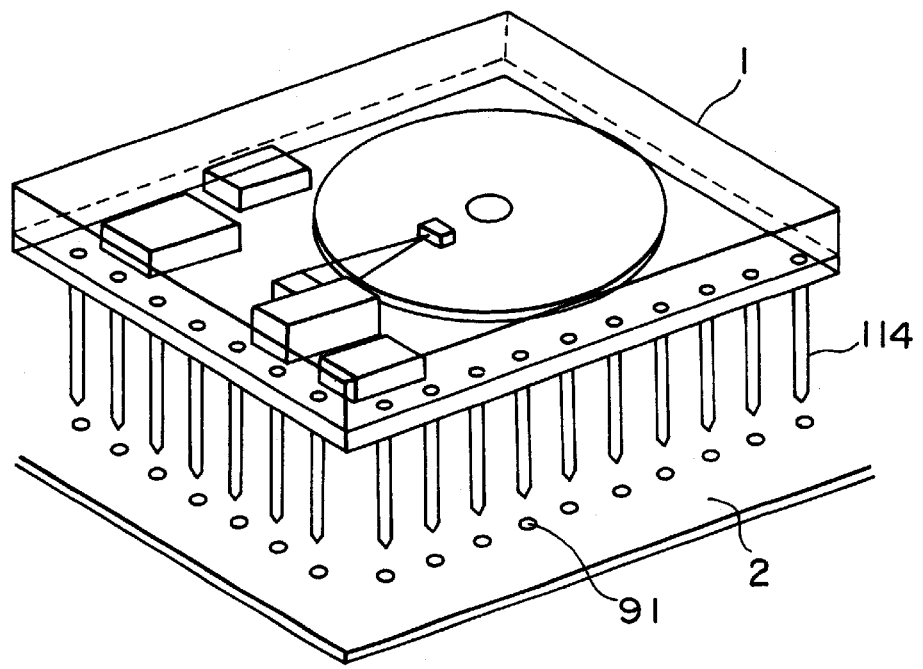
FIG. 6 is a perspective view showing the whole of a disk drive apparatus which adopts the PGF leads.

The fifth embodiment is substantially identical with the first embodiment in structure and has a feature that PGA (pin grid array) leads 114 are adopted as the leads 11 as shown in FIG. 6. The PGA type leads 114 are disposed on the lower surface of the SHDD 1.

The SHDD 1 of the present embodiment is mounted on and connected with the circuit board 2 by inserting the PGA type leads 114 into through-holes 91 provided on the circuit board 2 as the contact terminals 9.

As mentioned above, any designs for contacting with the board which are used for conventional electronic components may be adopted.

Embodiment 6

The present embodiment is substantially identical with the first embodiment in structure and has a feature that the leads 11 and the connection terminals 9 comply with a connector having SCSI (Small Computer System Interface) specifications.

Figures 7, 8, 9:
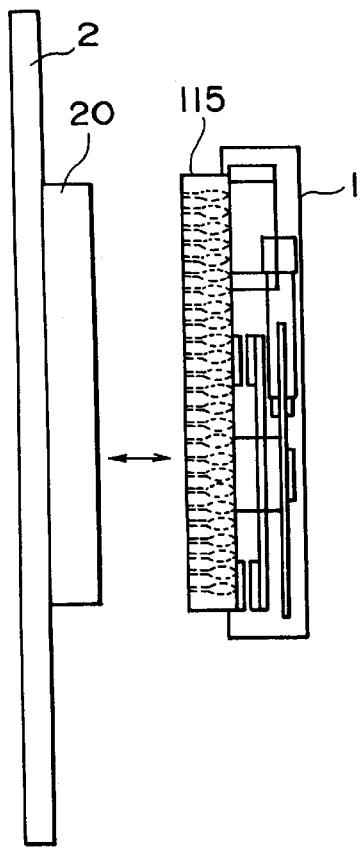
FIG. 7 is an elevational view showing a disk drive apparatus which adopts the SCSI specification leads and a board therefor.
FIG. 8 is a diagram showing an SCSI pin arrangement.
FIG. 9 is a diagram showing the pin arrangement of the disk drive apparatus.

The leads 11 of the SHDD 1 can be provided in a desired arrangement at desired positions. In the present embodiment, the SHDD 1 is provided with leads 115 which comply with the SCSI specifications as shown in FIG. 7. On the other hand, a SCSI connector 20 is provided as the connection terminals on the circuit board 2. The pin arrangement of the SCSI specification leads 115 is shown in FIG. 8.

Mounting of the SHDD 1 is completed by directly connecting the SCSI specification leads 115 to the SCSI connector 20.

The present embodiment has been described with reference to SCSI used as a standard interface. The present invention is not limited to only SCSI. It is possible to make the leads comply with other interface specifications such as ESDI.

It is possible to make the number of communication signals between the SHDD 1 and the information processing unit 5, equal to 18 by omitting a ground signal as shown in FIG. 9.

In this case, the 18 communication signals includes 9 control signals (ATN, BSY, ACK, RST, MSG, SEL, C/D, REQ, I/O) and 9 data bus signals (8 bit data+1 bit parity).

If power source lines (power supply and ground) are introduced via the leads 11, the number of the connection lines may be 20.

Embodiment 7

Figure 10:
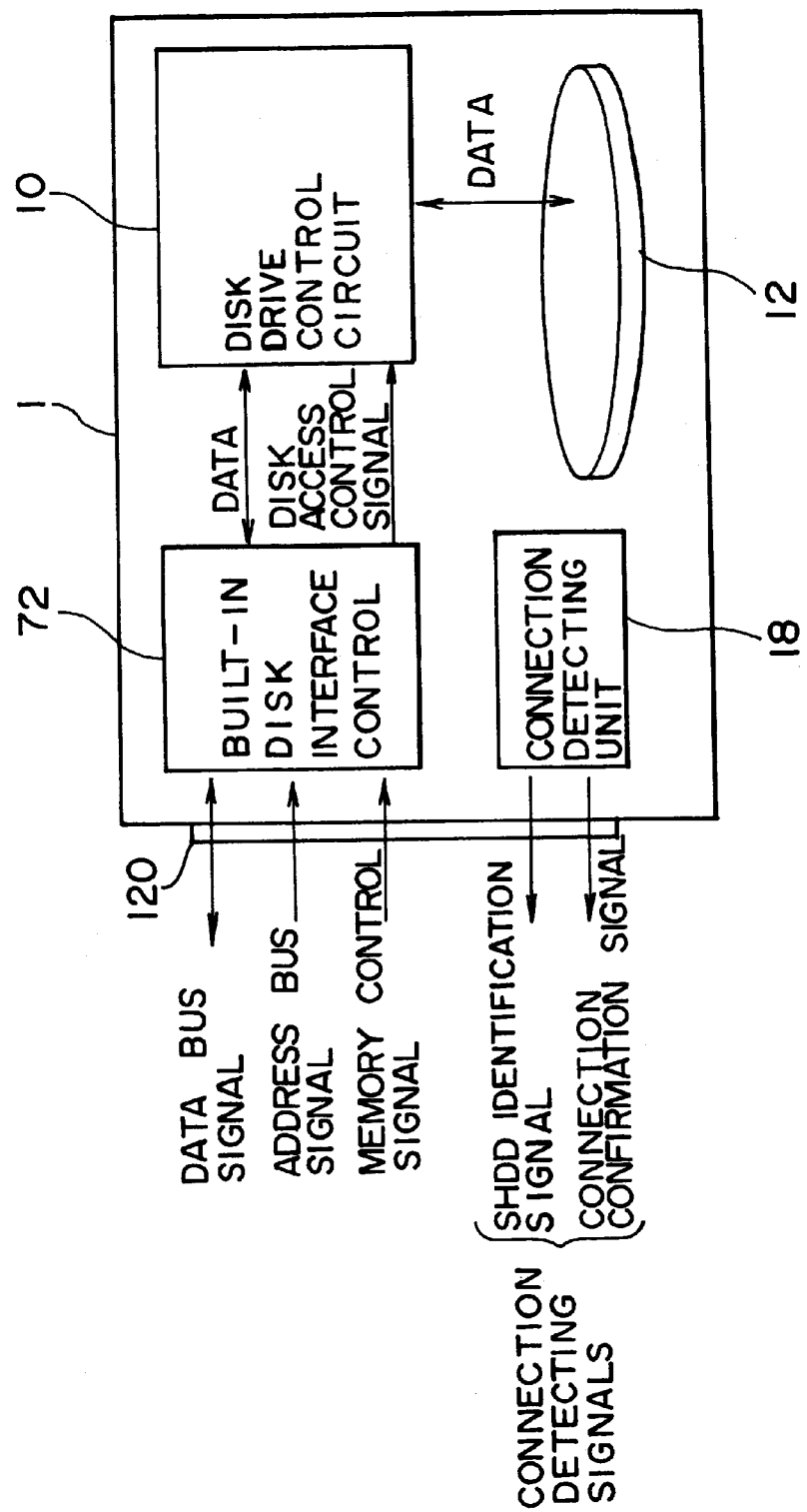
FIG. 10 is a block diagram showing a disk drive apparatus which can be used like a memory card.

The structure of the seventh embodiment of the SHDD 1 will be described with reference to FIG. 10.

The SHDD 1 comprises a built-in disk interface control 72 and a disk drive control circuit 10. In this case, the disc drive control circuit 10 includes a read/write circuit and a magnetic head positioning control circuit. The SHDD 1 also includes a connection detecting unit 18 for detecting the connection state of the SHDD 1.

The built-in disk interface control 72 of the present invention has an address bus signal, a data bus signal and a memory control signal as connection signals which are outputted to and inputted from the information processing unit 5. This enables the SHDD 1 to be used like a memory card.

The connection detecting unit 18 has connection detecting signals for confirming the connection between the SHDD 1 and the circuit board 2. The connection detecting signals are outputted via a connecting unit 120 and include an SHDD identification signal and a connection confirmation signal.

The SHDD identification signal corresponds to an identification signal of RAM or ROM of the memory card and is identical with the RAM identification signal in the case of SHDD connection.

Figure 11:
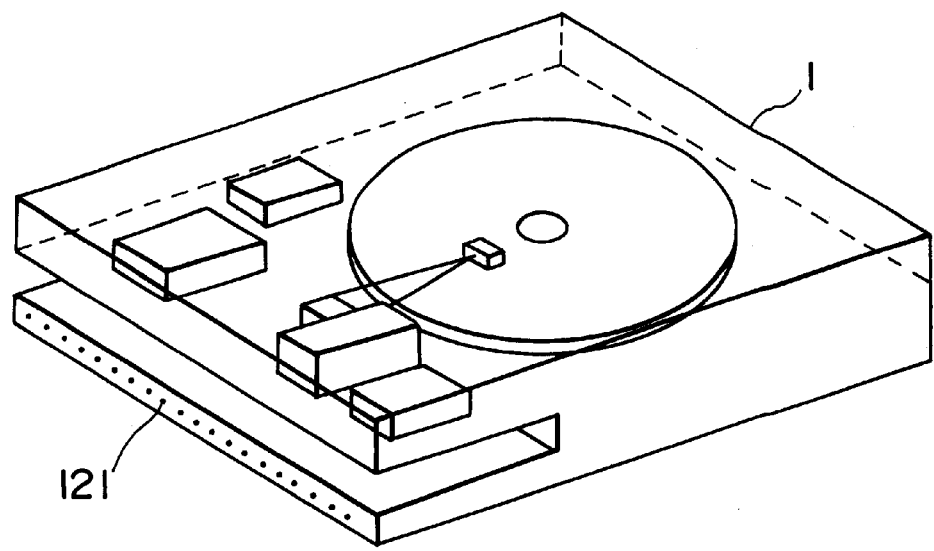
FIG. 11 is a perspective view showing the whole of a disk drive apparatus which adopts a microtribeam connector.

In this embodiment, a microtribeam type connector 121 which is used for mounting the memory card is adopted for the connecting unit 120 between the SHDD 1 and an external circuit, that is, a portion corresponding to the leads 11 of the embodiment 1. The microtribeam connector 121 is illustrated in FIG. 11. Although not shown, a connector corresponding to the microtribeam type connector 121 is provided on the board on which the SHDD 1 is to be mounted.

Mounting of the SHDD 1 is completed by connecting the microtribeam type connector of the SHDD 1 to the connector (not shown) provided on the circuit board.

At this time, the connection detecting unit 18 feeds the SHDD identification signal and the connection confirmation signal to the information processing unit 5 so that the connection is confirmed.

On the writing of data, the built-in disk interface control 72 generates and feeds a disk access control signal and data to the disk drive control circuit 10 in response to the address bus signal, the memory control signal and the data bus signal which are inputted via the connecting unit 120.

The control circuit 10 performs writing of data into the magnetic disk in response to the disk access control signal and the data.

Reading of the data is achieved by carrying out the reverse of the foregoing operation.

In the present embodiment, operation control of the SHDD 1 is enabled by the data bus, the address bus and the control signals used in the memory card. That is, a system bus of an information processing system on which the SHDD 1 is mounted can be directly connected with the SHDD 1. Accordingly, connection of the SHDD 1 with computers having different disk drive connection specifications is possible via the system bus.

Figure 12:
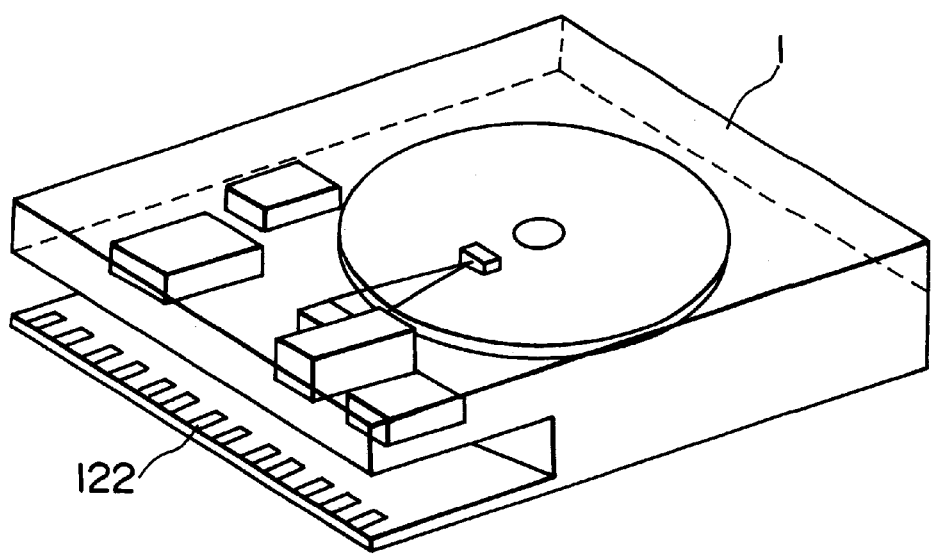
FIG. 12 is a perspective view showing the whole of a disk drive apparatus which adopts a multi-contact rotary connection connector.

The design of the connecting unit 120 is not limited to only that described in this embodiment. The connecting unit 120 may be, for example, a multi-contact rotary type connector 122 as shown in FIG. 12.

Embodiment 8

The present embodiment has a feature that use of the SHDD 1 is enabled in both a disk drive apparatus mode and a memory card mode.

Figure 13:
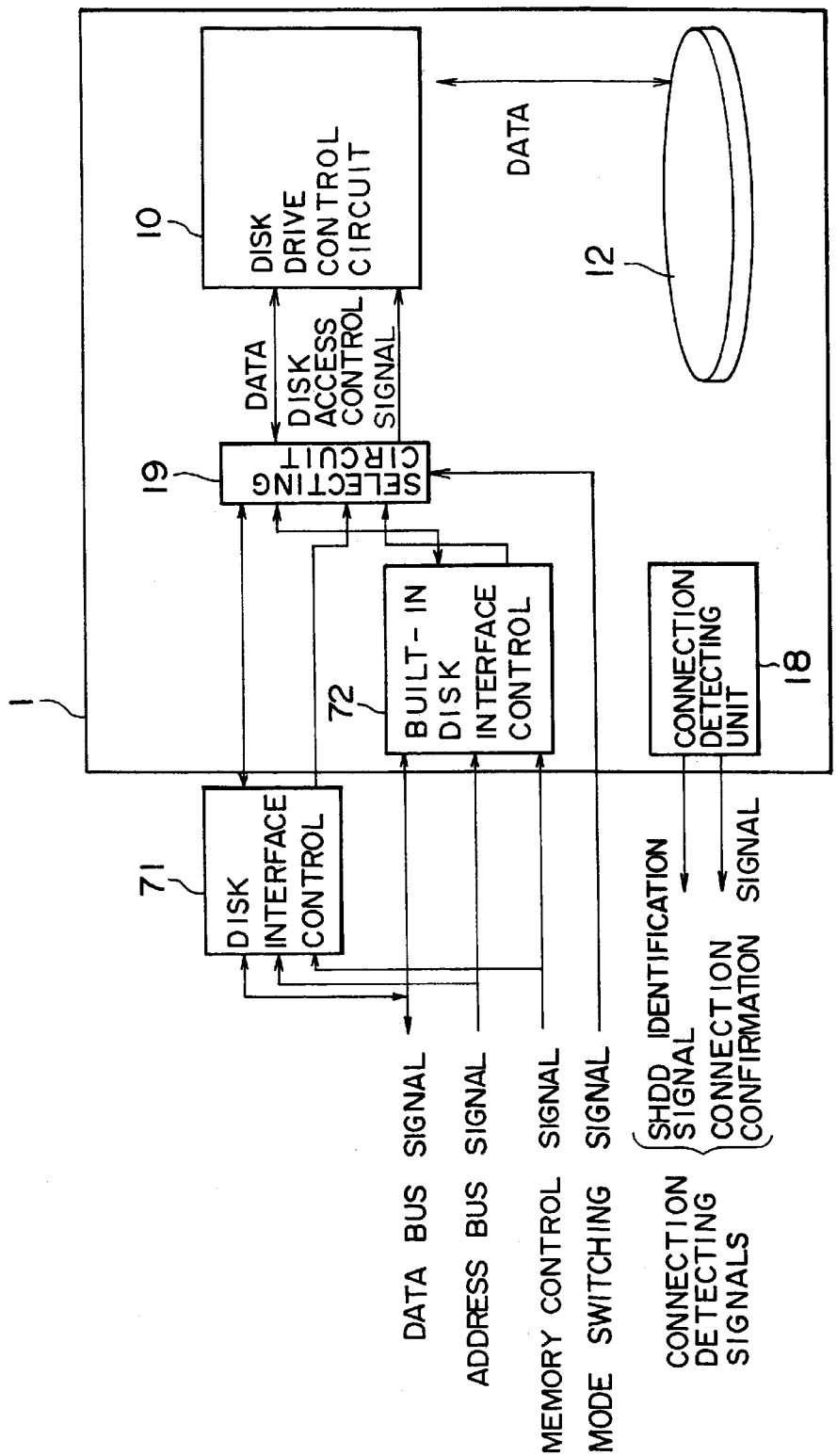
FIG. 13 is a block diagram showing a disk drive apparatus which can be used in two modes such as a disk drive apparatus mode and a memory card mode.

The structure will be described with reference to FIG. 13.

The SHDD 1 comprises a magnetic disk 12, a built-in disk interface control 72, a connection detecting unit 18 and a disk drive control circuit 10.

In the present embodiment, the SHDD 1 further includes a selecting circuit 19. A disk interface control 71 is provided outside the SHDD 1.

The selecting circuit 19 selects one of either the disk interface control 71 or the built-in disk interface control 72 in response to an externally inputted mode switching signal to bring the SHDD 1 into the disk drive apparatus mode or the memory card mode, respectively.

The magnetic disk 12, the built-in disk interface control 72, the connection detecting unit 18 and the disk drive control circuit 10 are identical to those of the embodiment 7.

Operation of the embodiment 8 will now be described.

In the disk drive apparatus mode, the disk interface control 71 is selected by the selecting circuit 19. An access to the magnetic disk 12 is performed in response to the disk access control signal and data which are outputs of the disk interface control 71. On the other hand, in the memory card mode, the built-in disk interface control 72 is selected by the selecting circuit 19. An access to the magnetic disk 12 is performed in response to the disk access control signal and data which are the outputs of the built-in disk interface control 72.

As mentioned above, in the present embodiment, the SHDD 1 can be used in either the disk drive apparatus mode or the memory card mode.

Embodiment 9

This embodiment has a feature that the SHDD 1 is mounted on the circuit board by using an SHDD mounting socket 23.

Figure 14:
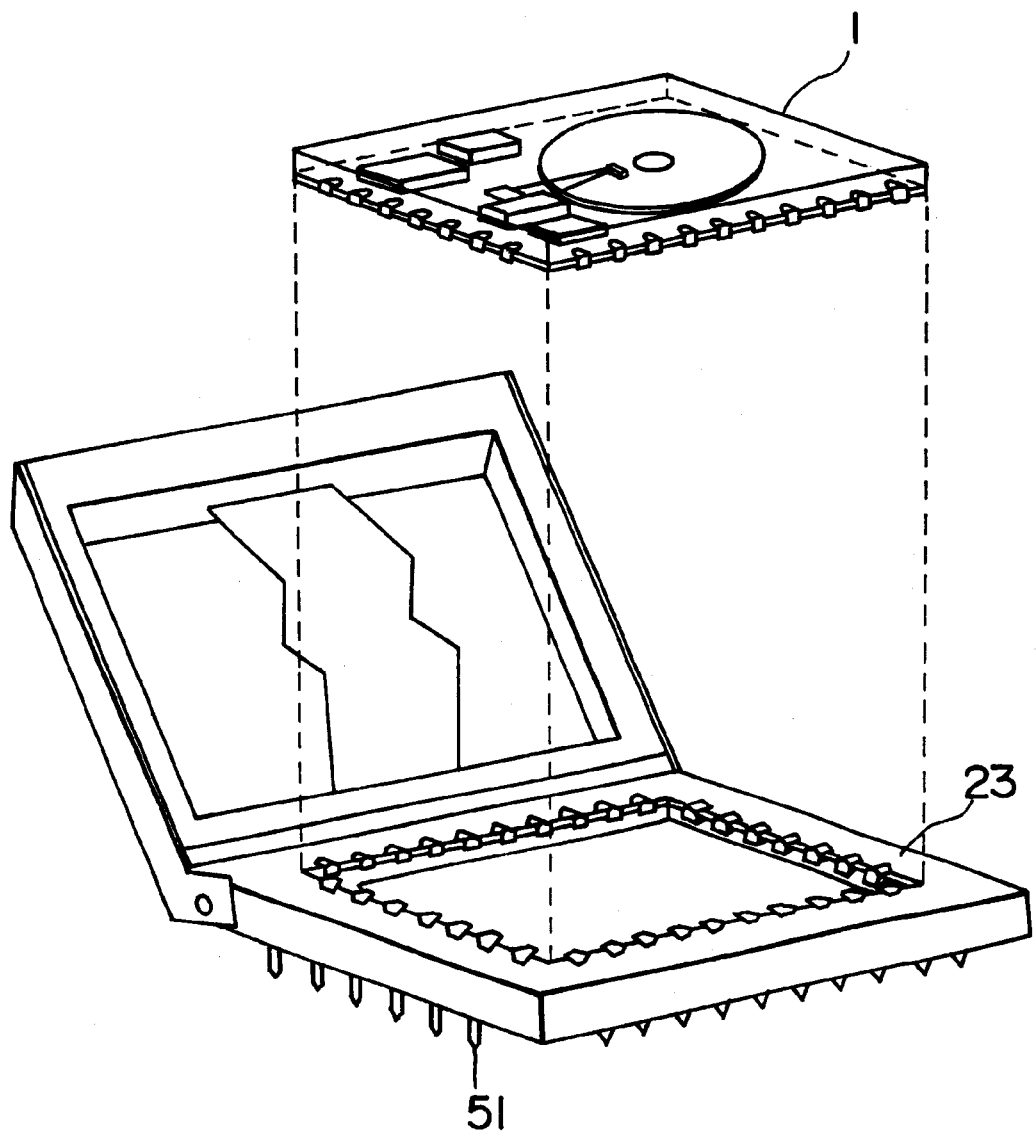
FIG. 14 is a perspective view showing the whole of a disk drive apparatus which adopts the PLCC leads and a socket for the same.

The embodiment will be described with reference to FIG. 14.

The SHDD 1 of the present embodiment is designed with a PLCC type connecting unit as shown in the embodiment 3, that is, the PLCC type leads 112. The design of the connecting unit is not limited to only that shown in the drawing.

The SHDD mounting socket 23 secured on the circuit board 2 has such a design and a dimension that it can house the SHDD 1 therein and the socket 23 has connection terminals 9 corresponding to the PLL type leads 112. The SHDD mounting socket 23 is provided on the lower surface thereof with board mounting leads 51 for securing the SHDD mounting socket 23 on the board.

The SHDD mounting socket 23 is preferably composed of a vibration absorbing member made of an elastic material having a vibration absorbing capability.

The SHDD 1 is mounted on the circuit board by inserting the SHDD 1 into the SHDD mounting socket 23.

Embodiment 10

A vibration absorbing capability is provided by using elastomers (rubber and the like) for securing means of the board, for example, screws.

In accordance with the present invention, the SHDD 1 is directly mounted onto the same circuit board as the information processing unit including a CPU and the like. Accordingly, it is necessary to provide the vibration absorbing capability to the SHDD 1 in a portion other than the portion where it connects with the circuit board.

In the present embodiment, the vibration absorbing capability is provided in the socket when the SHDD 1 is mounted upon the circuit board by using the socket.

The present embodiment will be described with reference to FIG. 15.

The SHDD mounting socket 23 is provided with dampers 50 made of leaf springs on the inner upper and lower sides thereof.

The SHDD 1 is supported and fixed by the dampers 50 in the SHDD mounting socket 23.

The SHDD mounting socket 23 is provided with board mounting leads 51 on the outer lower side thereof. The SHDD 1 is bonded and fixed to the circuit board by the leads 51. The leads 11 of the SHDD 1 are connected with the board mounting leads 51 of the SHDD mounting socket 23 via leads 52.

Figure 16:
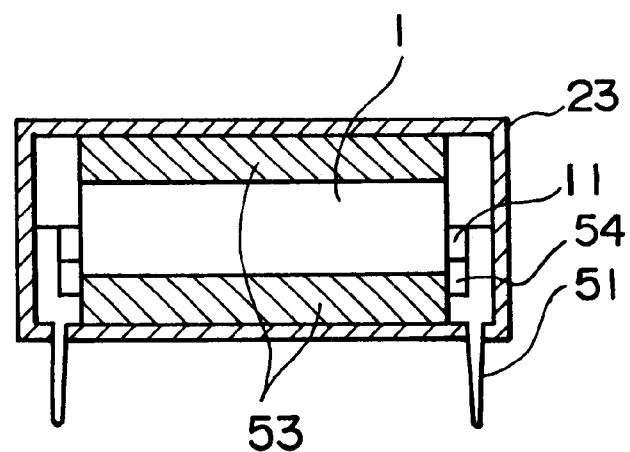
FIG. 16 is an elevational view showing a socket which is provided with dampers therein.

The dampers 50 are not limited to only leaf springs and may be an elastomer member 53 made of rubber, etc., as shown in FIG. 16.

Figure 15:
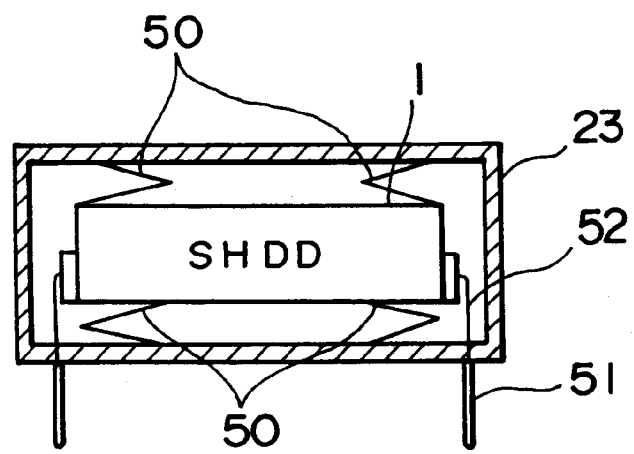
FIG. 15 is an elevational view showing a disk drive apparatus which adopts the DIP leads.

Means for contacting the leads 11 of the SHDD 1 with the leads 51 of the SHDD mounting socket 23 is not limited to only the leads 52 shown in FIG. 15, and may be pressure contacts 54 which are shown in FIG. 16. The SHDD mounting socket 23 on which the SHDD 1 is mounted can be considered as a single SHDD.

In the present embodiment, vibrations and impacts on the board can be absorbed between the mounting socket 23 and the SHDD 1.

Embodiment 11

Figure 17:
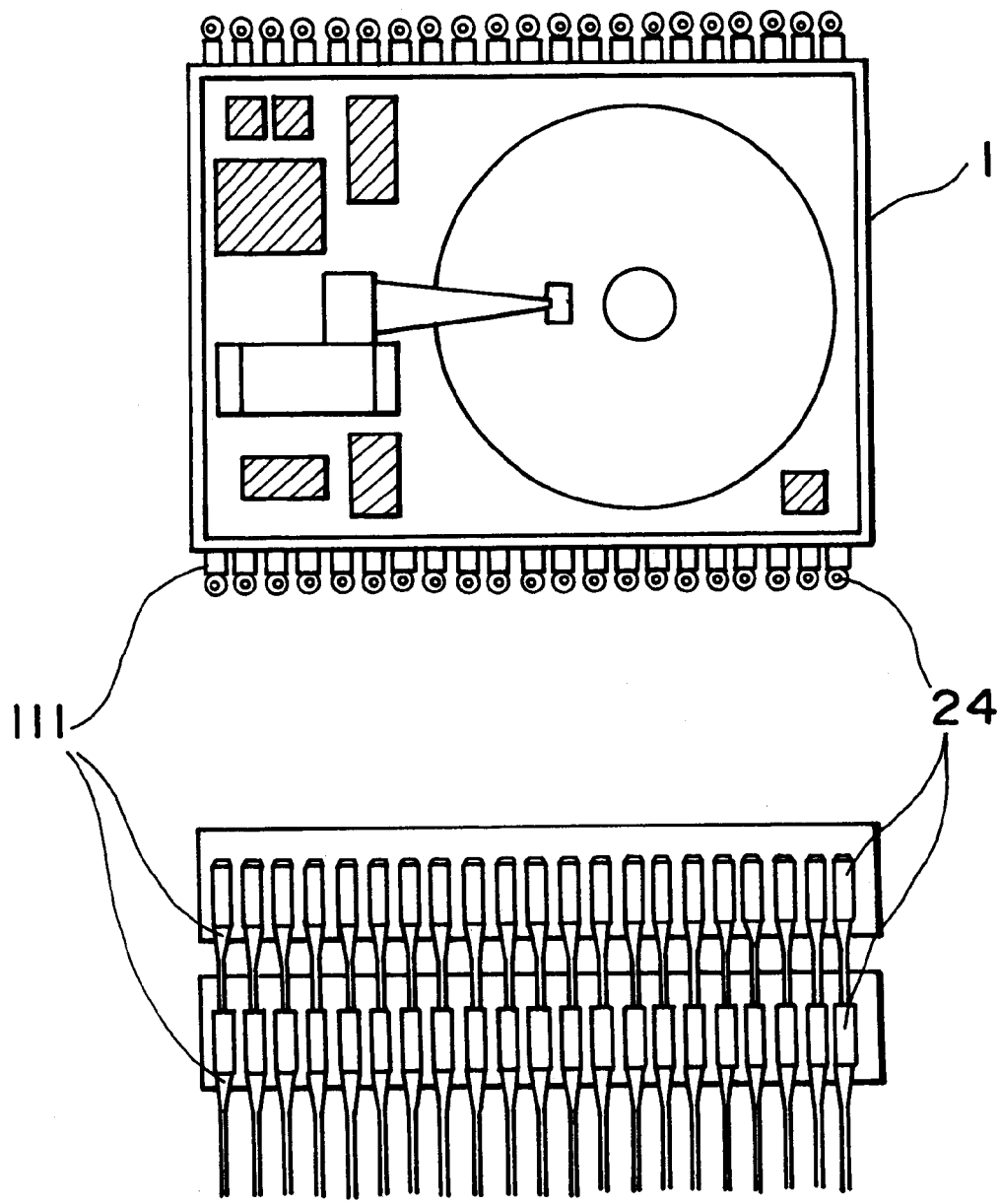
FIG. 17 is a top plan view and an elevational view showing a stack of two disk drive apparatuses.

Stacking of the SHDD 1 is achieved as shown in FIG. 17 in the present embodiment.

The SHDDs 1 are provided with leads 11 which are identical with those of embodiment 1. The leads 11 are DIP type leads 111 which are inserted into through-holes provided on the board. Each of the DIP leads 111 is provided with an insertion portion 24 having the same design as the through-holes into which one of the other DIP type leads 111 can be inserted.

A plurality of the SHDDs 1 are bonded with each other by the leads 11 by stacking one SHDD 1 on the other SHDD 1 and inserting the DIP type leads 111 of the upper SHDD 1 into insertion portions 24 of the lower SHDD 1. This makes it possible to mount a stack of the SHDDs 1 on the board.

The insertion portions 24 provided on the leads 11 may be used for insertion or connecting of electronic components which are required for insertion or removal of the SCSI termination resistors.

In the present embodiment, stacking of the SHDD 1 is possible. No additional area for mounting of an additional SHDD 1 is required and the mounting board can be effectively used. Although the SHDD 1 is mounted on the board so that the side of the SHDD 1 having the widest area faces to the board, the side of the SHDD 1 which faces to the board is prescribed only by the conditions for the SHDD 1 providing direction.

Embodiment 12

Figure 18:
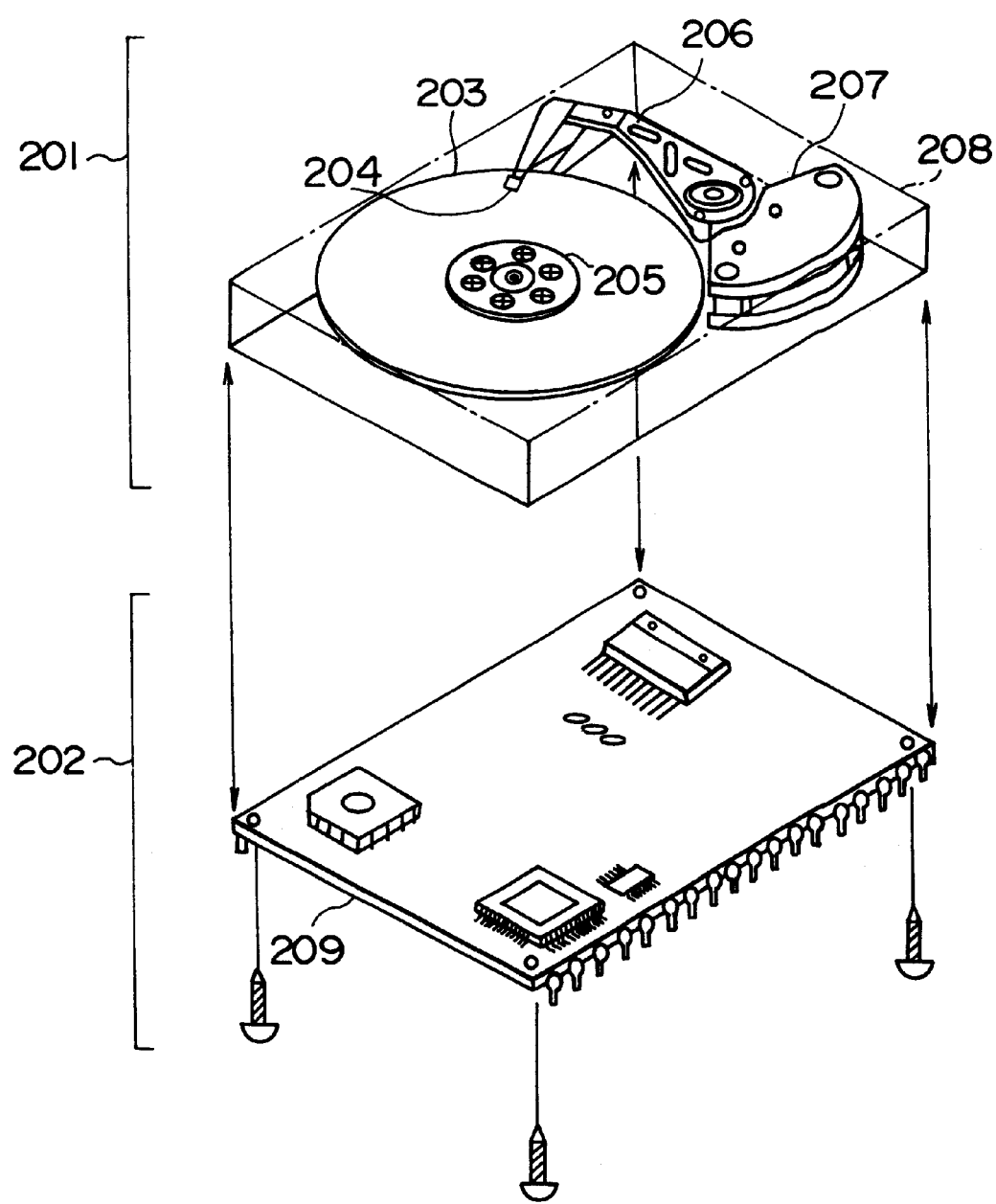
FIG. 18 is an exploded perspective view showing an embodiment of a disk drive apparatus of the present invention.

Referring now to FIG. 18, there is shown an exploded perspective view of the SHDD. The SHDD comprises a mechanism 201 and an electronic circuit 202 for controlling the mechanism 201. The mechanism 201 comprises a magnetic disk 203, a magnetic head 204 for writing and reading data to or from the magnetic disk 203, a spindle motor 205 for rotating the magnetic disk 203, a guide arm 206 for supporting the magnetic head 204, a VCM (voice coil motor) 207 for moving the magnetic head 204, a casing 208 for encasing the aforementioned components 203 to 207 and an electronic circuit board 209 for controlling the aforementioned parts, that is, magnetic disk 203 to VCM 207. The electronic circuit board 209 constitutes a part of the casing 208 for encasing the mechanism 201. This board 209 provides a member to support the mechanism 201 so that the SHDD can be miniaturized. If the circuit board 209 is made of ceramics having an excellent heat dissipating ability, miniaturization of the circuit can be achieved by directly mounting LSI chips on the board in a bare chip manner without encasing the LSI chips in packages. Since the circuit board is large in size in comparison with the LSI package, it will become easier to thermally design the LSI. In accordance with the present embodiment, an ultra small magnetic disk drive which is suitable for incorporation into an apparatus can be provided.

Embodiment 13

Figure 19:
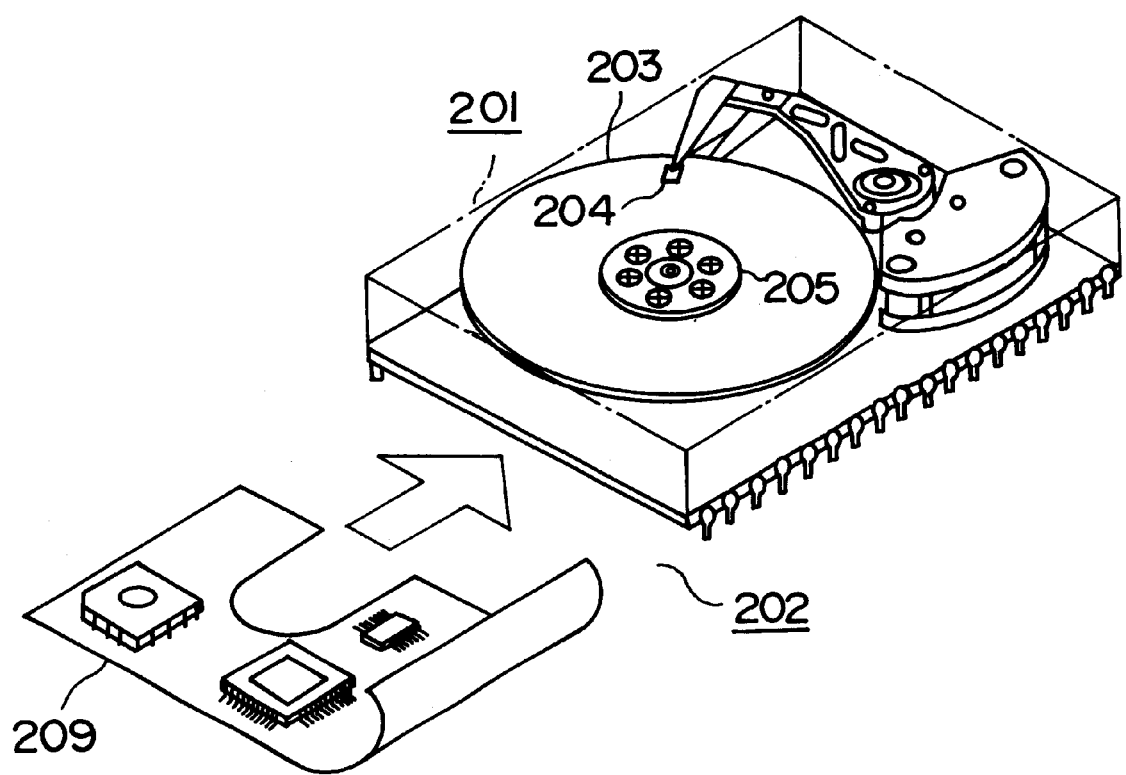
FIG. 19 is a perspective view showing another embodiment of a disk drive apparatus.

Referring now to FIG. 19, there is shown an exploded perspective view of an embodiment of an SHDD of the present invention. The SHDD comprises a mechanism 201 and an electronic circuit 202 for controlling the mechanism 201. The mechanism 201 is identical with that shown in FIG. 18. The electronic circuit board 209 is in the form of a flexible film on which electronic components are mounted. This packaging enables the components to be received in a free space of the casing of the SHDD so that miniaturization of the SHDD is achieved. In consideration of the thermal radiation of the electronic components, the circuit board may be provided outside the casing of the SHDD or alternatively provided in a free space in an external system into which the SHDD is incorporated. In accordance with the present embodiment, an ultra small magnetic disk drive which is suitable for incorporation into an apparatus can be provided.

Embodiment 14

Figure 20:
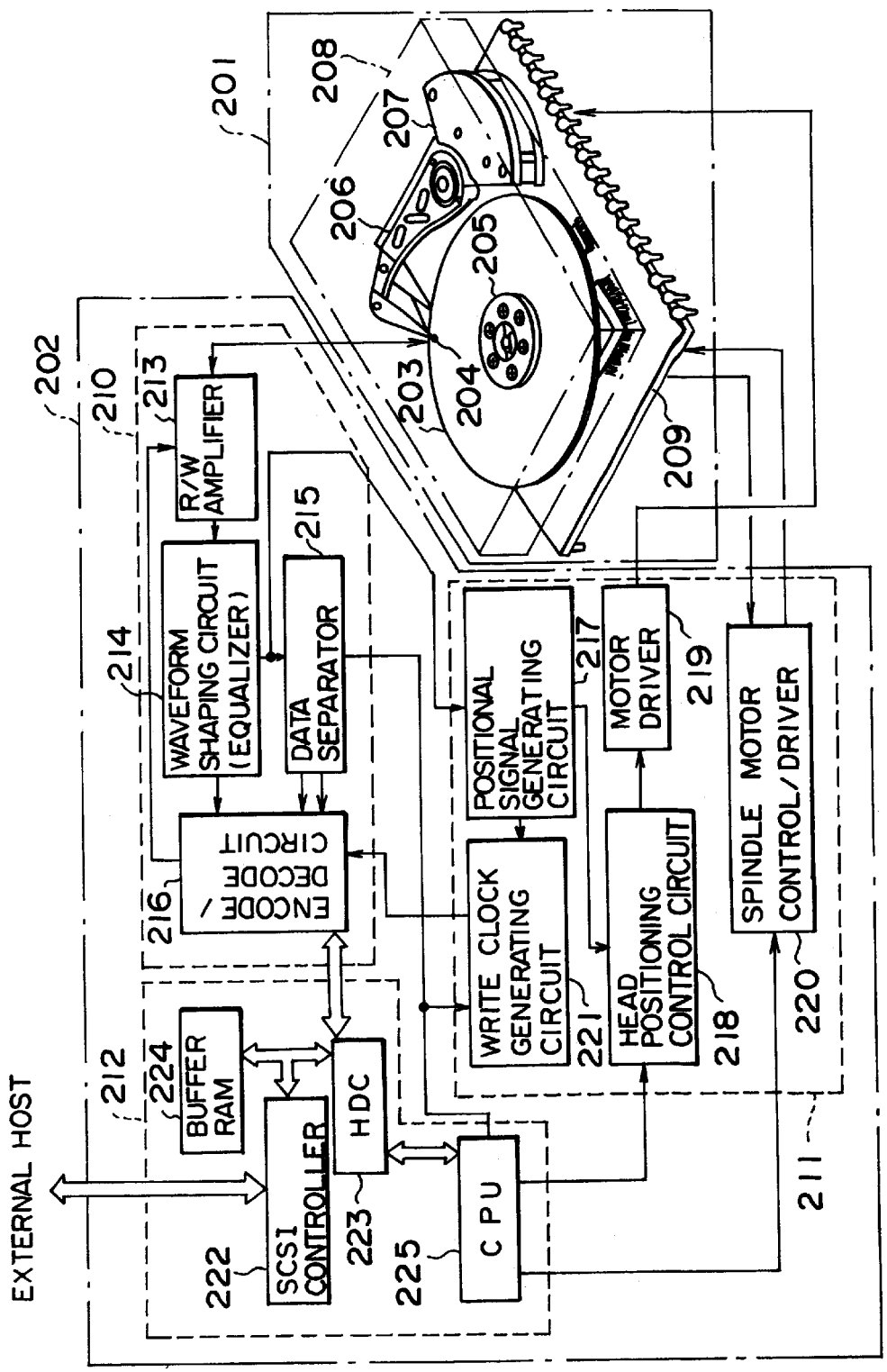
FIG. 20 is a partial block diagram and a partial perspective view showing a further embodiment of the present invention.

Referring now to FIG. 20, there is shown a block diagram and a perspective view showing another embodiment of an SHDD of the present invention. The SHDD comprises a mechanism 201 and an electronic circuit 202 for controlling the mechanism 201. The block diagram shows the circuit configuration of the electronic circuit 202. The mechanism 201 comprises a magnetic disk 203 for storing the data, a magnetic head 204 for writing and reading data to and from the magnetic disk 203, a spindle motor 205 for rotating the magnetic disk 203, a guide arm 206 for supporting the magnetic head 204, a VCM 207 for moving the magnetic head 204, a casing 208 for encasing therein the aforementioned components 203 to 207 and an electronic circuit board 209 for supporting the components from the magnetic disc 203 to the VCM 207. The electronic circuit 202 for controlling the mechanism comprises a read/write function unit 210 for writing and reading data onto and from the magnetic disk 203, mechanism control 211 for controlling the position of the magnetic head 204 to a desired track and for controlling the rotational speed of the magnetic disk 203, and a data control 212 for controlling the data fed between the read/write function unit 210 and an external host. Each unit is formed as follows: The read/write function unit 210 comprises a R/W amplifier 213 for recording and reproducing data on and from the magnetic disk 203, a waveform shaping circuit 214 for shaping the waveform of the read signal from the magnetic disk, a data separator 215 for extracting a reference clock from the read signal the waveform of which has been shaped, and a encode/decode circuit 216 for converting the codes recorded on the magnetic disk into NRZ codes based upon the waveform shaped by the waveform shaping circuit 214 and the reference clock, and for converting NRZ signals fed from the data control unit 212 into codes which are suitable for recording on the magnetic disk 203. The mechanism control 211 comprises a positional signal generating circuit 217 for generating positional information about the magnetic head 204, a head positioning control circuit 218 for controlling the positioning of the magnetic head 204 in response to the positional information, a motor driver 219 for feeding the output of the head positioning control circuit 218 to the VCM 207, a spindle motor control/driver 220 for controlling the rotational speed of the spindle motor 205 and a write clock generating circuit 221 for feeding a write clock to the read/write function unit 210 based on the output of the positional signal generating circuit 217. The data control 212 comprises an SCSI controller 222 for controlling the SCSI proctol which is standard for the transfer of data to and from an external host, HDC (hard disk controller) 223 for converting parallel data from an external system into data (generally serial data) suitable for recording and reproducing on and from the magnetic disk 203, a buffer RAM 224 for adjusting for the difference in the data transfer rate between the external host and the HDC 223 and the data transfer rate between the HDC 223 and the magnetic disk 203, and a CPU 225 for controlling all of the units in the SHDD. A large quantity of data can be stored on the magnetic disk 203 by making the external dimension of the magnetic disk 203 about 1.7 inch and by providing means for changing the frequency of the read clock generated by the data separator 215 and the frequency of the write clock of the write clock generating circuit 221 depending upon the reading and writing position of the magnetic head 204 upon the magnetic disk 203. Low power consumption of the SHDD can be provided by providing the spindle motor control/driver 220 with means for changing the rotational speed of the magnetic disk 203. Recording of a large quantity of data on the magnetic disk 203 may be provided by using the means for changing the rotational speed without providing means for changing the frequency of the clock for recording and reading data on and from the magnetic disk 203. In order to record a large quantity of data on the magnetic disk 203, the track density is made not less than 2500 TPI (tracks per inch). This can be achieved by providing a head positioning control circuit 218 adopting a data-surface servo system in which the magnetic head for reading the positioning signal of the magnetic head is the same magnetic head used for reading and writing data. Of course, in order to achieve the track density, the servo-surface servo system may be used, or the servo-surface servo system and the data-surface servo system may be used at seeking and following times, respectively. Alternatively, a combination of the servo-surface servo system and the data-surface servo system may be used. In accordance with the foregoing description a very small, high capacity and low power consumption SHDD which is suitable for incorporation into an apparatus can be provided. Although the embodiment in which the VCM which is a rotary moving type is used as the system for moving the magnetic head has been described, it is also possible to use a linear motor which is a linear moving type.

Embodiment 15

Figure 21:
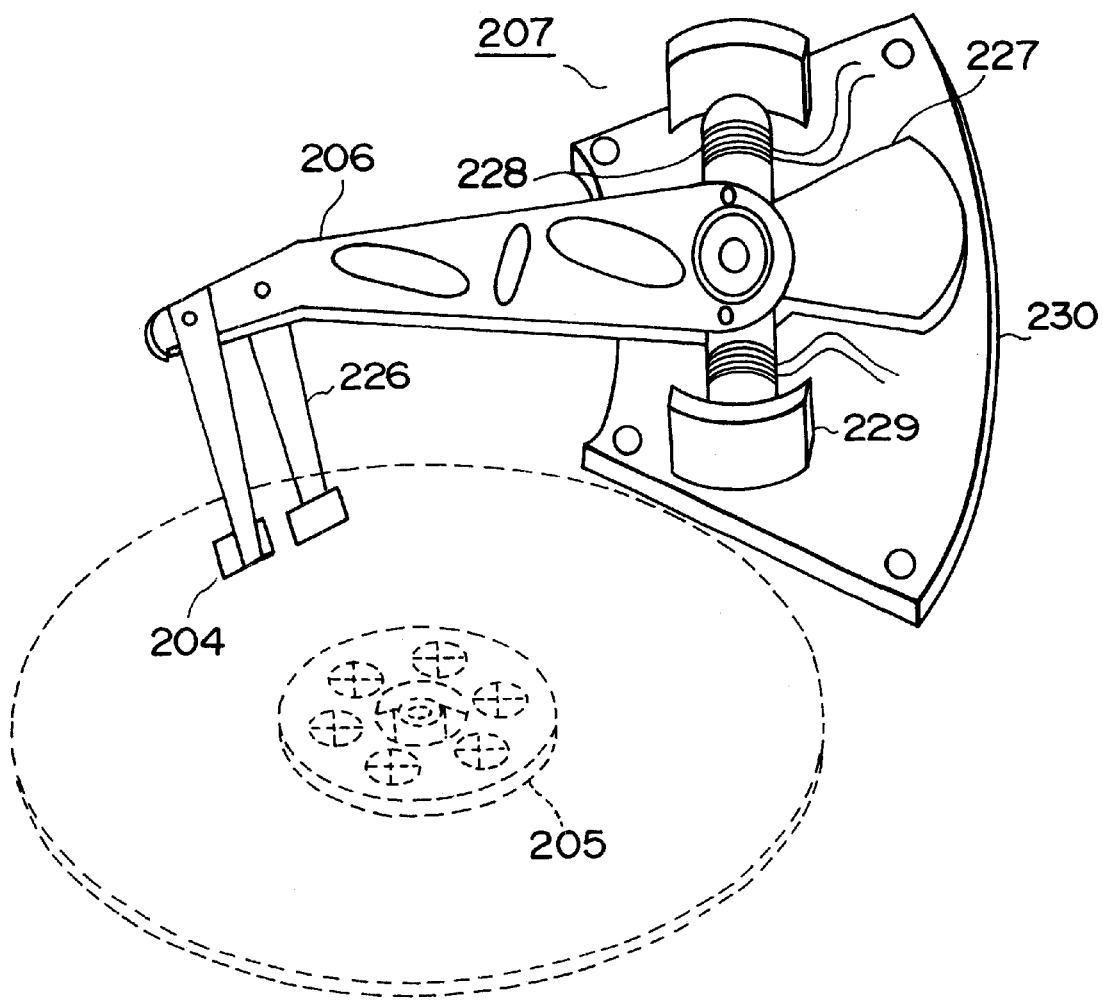
FIG. 21 is a perspective view showing a VCM (voice coil motor of a disk drive apparatus of the present invention.

Referring now to FIG. 21, there is shown a perspective view of an SHDD of the present invention. The VCM 207 comprises a magnetic head 204, a gimbal 226, a guide arm 206, a counter balance 227, a coil 228, a magnet 229 and a carriage 230. The counter balance 227 statically balances with the total mass of the magnetic head 204, the gimbal 226, and the guide arm 206 and a rotary shaft. The coil 228 is provided so that a rotary axis of the rotary shaft is aligned with the center of an applied force. If the rotary axis of the rotary shaft is not aligned with the center of the applied force, the rotary shaft is struck upon driving of the VCM 207 to cause the tip end of the magnetic head 204 to oscillate. The oscillation at a following time lasts for a considerable period of time. Accordingly, the control performance is degraded. Since the rotary axis of the rotary shaft is aligned with the center of force in the present embodiment, the residual oscillation at a following time can be remarkably reduced to enhance the control performance. In accordance with the present embodiment, an SHDD suitable for incorporation into an apparatus in which the control performance for positioning the magnetic head is remarkably enhanced can be provided.

Embodiment 16

Figure 22:
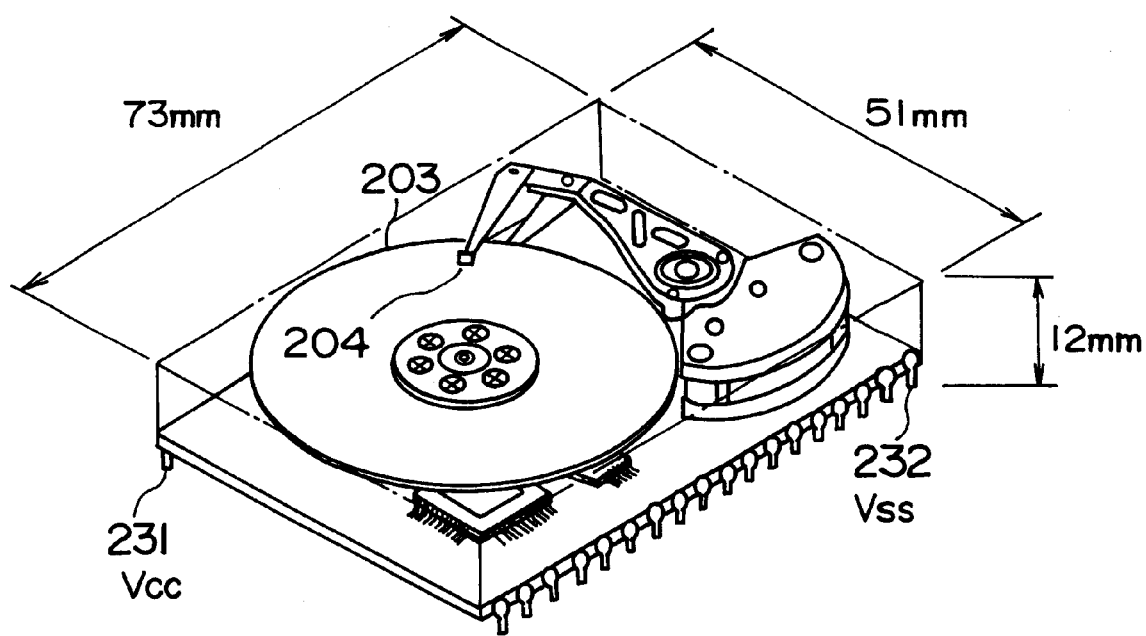
FIG. 22 is a perspective view showing a further embodiment of a disk drive apparatus of the present invention.

Referring now to FIG. 22, there is shown a perspective view of an embodiment of an SHDD of the present invention. Today, more compact and light weight SHDDs have been in demand to fulfill the demands for compact and light weight machines such as portable personal computers. Accordingly, an SHDD mounted on a portable personal computer is about 12 mm in height, about 73 mm in width and about 51 mm in depth. Only one magnetic disk is mounted since the SHDD is only 12 mm in height. The one magnetic disk is capable of storing at least 40 M bytes in view of the processing capacity of the personal computer on which the SHDD is mounted.

A power source for supplying power to the SHDD is a single power source which is currently and widely most used in small office automation equipment. The voltage of the power source is about 5 volts or about 3.3 volts which is capable of driving the SHDD.

The method of supplying the power source voltage to the SHDD is the same as the method of supplying the power source voltage to the DIP type of existing TTL devices. Specifically, the power supplying terminals 231 and 232 are located at the left upper edge and the right lower edge of the drive, respectively, as viewed from an upper position when the longitudinal side of the drive is horizontal. One terminal 231 is Vcc while the other terminal 232 is Vss. This prevents users from mixing up the terminals when designing or mounting the board.

In accordance with the present embodiment, a very small, high capacity and low power consumption SHDD which is suitable for incorporation into equipment can be provided. Since the power source terminals for receiving voltage supplied from the external system are provided on the electrical connection for transmitting and receiving control and data signals to and from the external system, an SHDD occupying less space for connection with the external system can be realized.

Embodiment 17

Referring now to FIG. 23, there is shown a perspective view showing a further embodiment of an SHDD. A method of supplying power to the SHDD is specifically shown. If a flat parallel cable as shown in the drawing is used, an external system and a signal connector 233 are provided with a power cable 235 for feeding power from the external system to the SHDD in parallel with a control signal/data signal cable 234. Use of a keyed flat cable connector prevents the SHDD from being broken by the application of an abnormal voltage due to misinsertion of the connector. Since the electric connector for inputting and outputting control signals and data signals to and from the external system has power terminals for receiving a voltage supplied from the external system, an SHDD occupying less space for connection with an external system can be provided. Analog and digital circuits may be separately powered in order to stabilize the operation of the electronic circuits of the SHDD.

Embodiment 18

Figure 24:
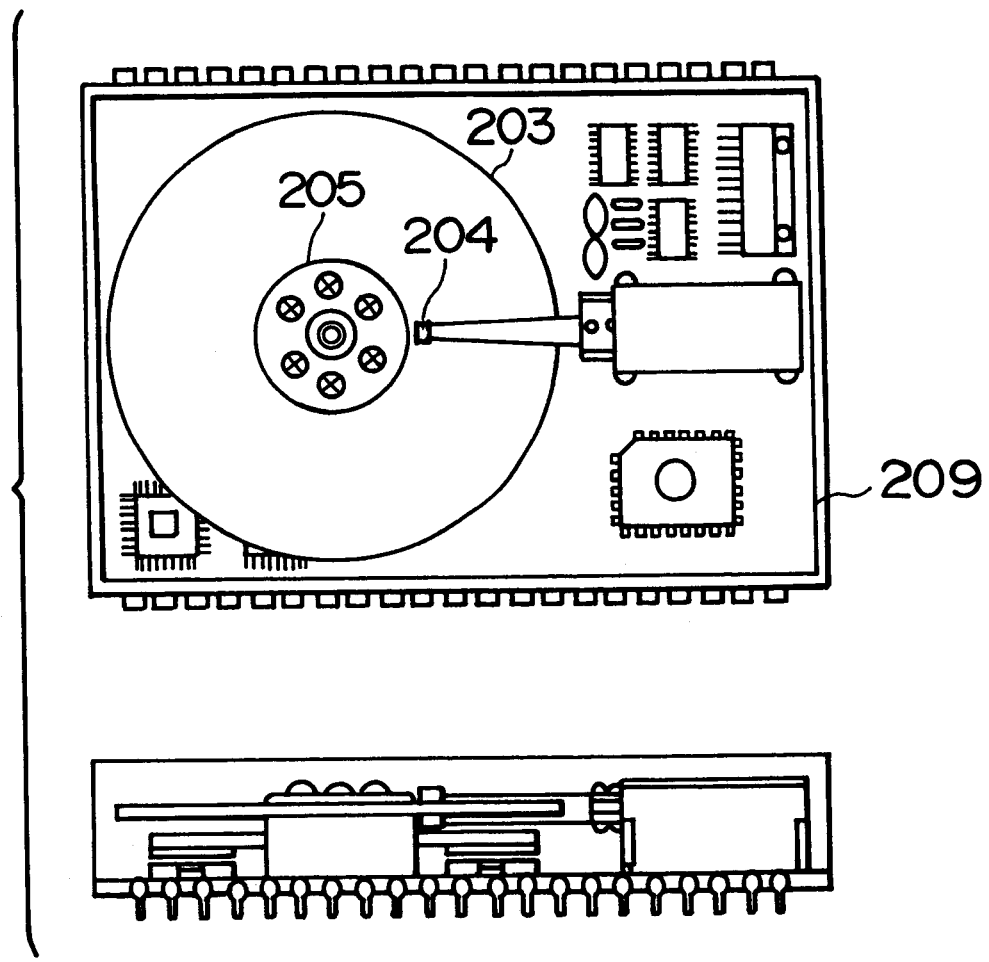
FIG. 24 is a top plan view and a side elevation view showing a spindle motor of a disk drive apparatus of the present invention.

Referring now to FIG. 24, there is shown a spindle motor for the SHDD. The spindle motor 205 is of an outer hub and outer wheel rotary type. A circuit board also functions as a member for supporting a spindle motor shaft. In accordance with the present embodiment, miniaturization of the spindle motor 205 can be achieved and the shaft torque can be increased. Accordingly, an SHDD having an effect to reduce the change in rotation can be provided. Of course, the spindle motor 205 may be of the outer hub and inner wheel type, or the inner hub and outer wheel rotary type, or the inner hub and inner wheel rotary type if miniaturization and stabilization of the rotation can be achieved.

Embodiment 19

Figure 25:
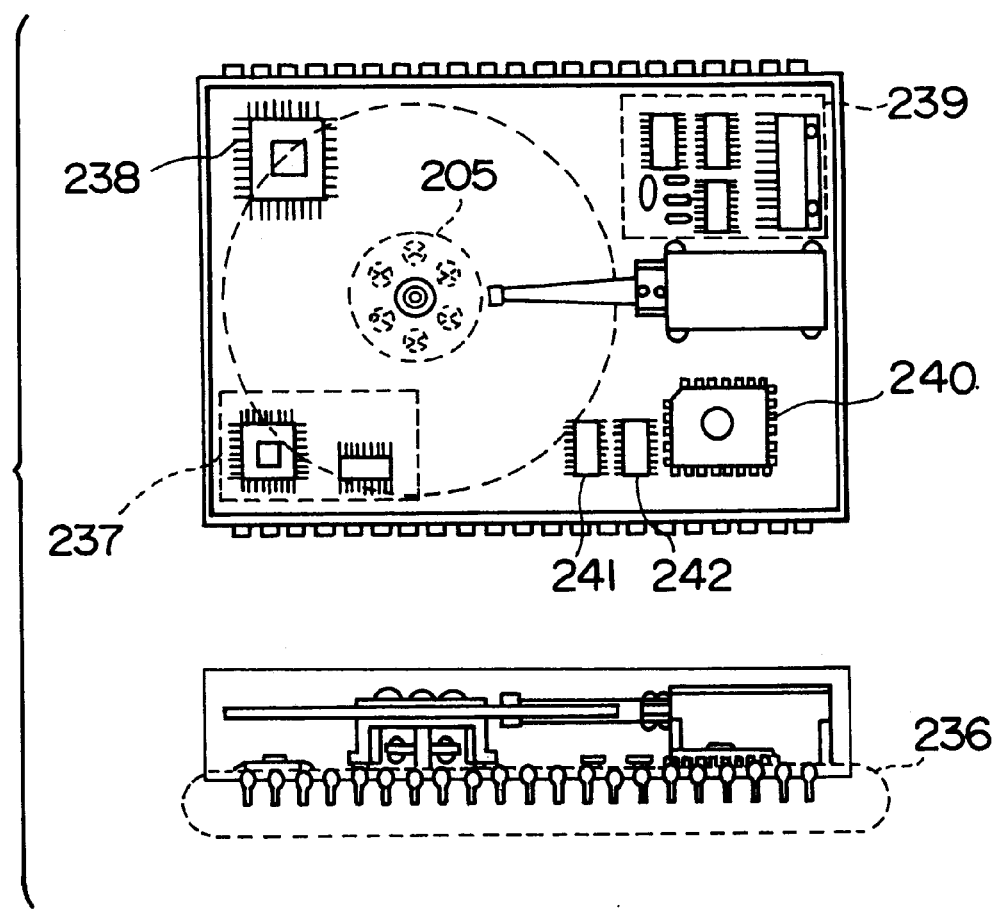
FIG. 25 is a top plan view and a side elevation view showing an electronic circuit board of a disk drive apparatus of the present invention.
Figure 26:
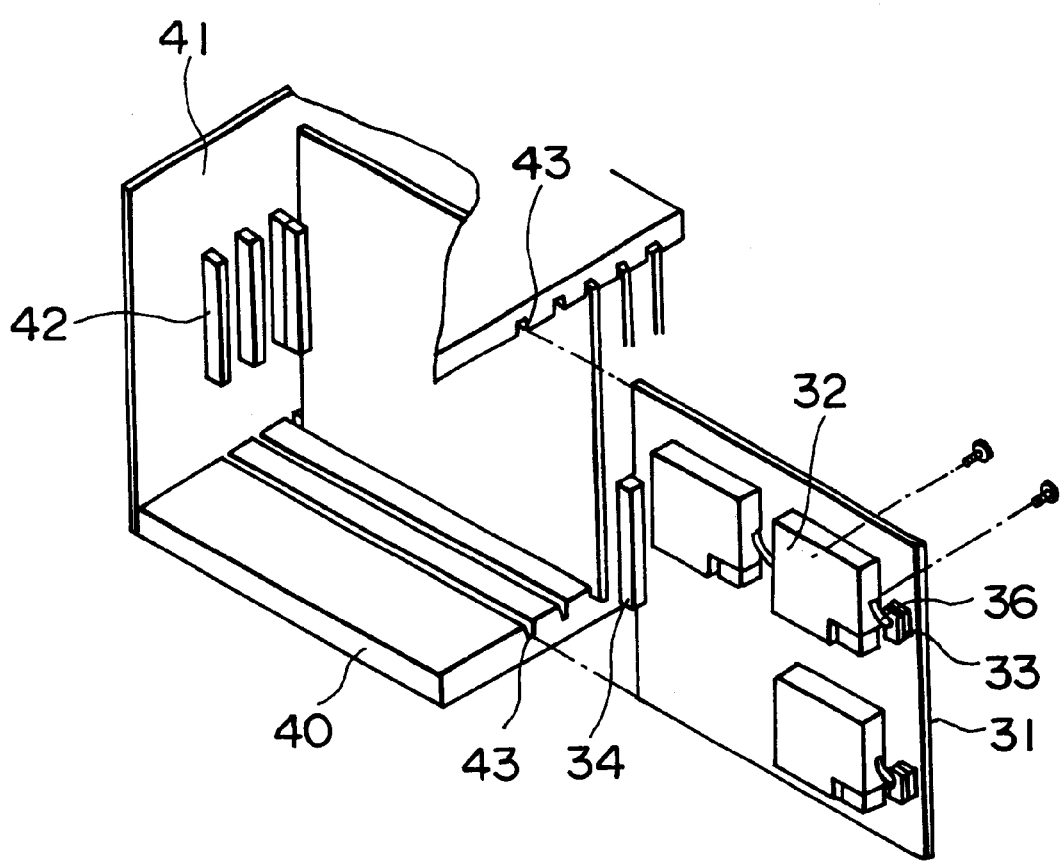
FIG. 26 is a perspective view showing an example of the prior art.

Referring now to FIG. 25, there is shown an electronic circuit board of an SHDD. The circuit board has a signal connecting unit 236. The electronic circuit includes a read/write signal processing LSI 237 for writing and reading data to and from the magnetic disk, a data control LSI 238 for controlling the data fed to and from an external system, an actuator control LSI 239 for controlling the positioning of the magnetic head and the rotation of the spindle motor 205, a microcomputer 240 for managing the control of the entire SHDD, and RAM 241/ROM 242 for storing data. Since signal connection units and electronic circuits are formed on one circuit board in accordance with the present embodiment, an SHDD can be provided.

Having described the present invention with reference to the embodiments of a magnetic disk drive apparatus, the present invention may of course be applicable to a disk drive apparatus for an optical disk.

What is claimed is:

1. A disk drive apparatus comprising:

a connecting unit, operable in an I/O interface mode in which the disk drive apparatus is used as a disk drive apparatus, and a memory card interface mode in which the disk drive apparatus is used as a memory card, for transferring data between the disk drive apparatus and an external circuit in accordance with a selected one of the I/O interface mode and the memory card interface mode; and storing means for storing interface mode identification information indicating which one of the I/O interface mode and the memory card interface mode is currently selected, the storing means storing the interface mode identification information in such a manner that the interface mode identification information can be read by the external circuit.

2. A method of controlling an interface mode in a disk drive apparatus connected to a host apparatus, the disk drive apparatus being operable in an I/O interface mode in which the disk drive apparatus is used as a disk drive apparatus, and a memory card interface mode in which the disk drive apparatus is used as a memory card, the method comprising the steps of:

selecting one of the I/O interface mode and the memory card interface mode;

storing, in the disk drive apparatus, interface mode identification information indicating which one of the I/O interface mode and the memory card interface mode is currently selected, the interface mode identification information being stored in the disk drive apparatus in such a manner that the interface mode identification information can be read by the host apparatus; and reading the interface mode identification information stored in the disk drive apparatus with the host apparatus.

3. A disk drive apparatus comprising:

a connecting unit, operable in an I/O interface mode in which the disk drive apparatus is used as a disk drive apparatus, and a memory card interface mode in which the disk drive apparatus is used as a memory card, for transferring data between the disk drive apparatus and an external circuit in accordance with a selected one of the I/O interface mode and the memory card interface mode;

a terminal for receiving an interface mode switching signal indicating which one of the I/O interface mode and the memory card interface mode is to be selected; and means, responsive to the interface mode switching signal, for controlling the connecting unit to transfer data between the disk drive apparatus and the external circuit in accordance with the selected one of the I/O interface mode and the memory card interface mode indicated by the interface mode switching signal.

4. A method of controlling an interface mode in a disk drive apparatus connected to a host apparatus, the disk drive apparatus being operable in an I/O interface mode in which the disk drive apparatus is used as a disk drive apparatus, and a memory card interface mode in which the disk drive apparatus is used as a memory card, the method comprising the steps of:

selecting one of the I/O interface mode and the memory card interface mode;

sending an interface mode switching instruction from the host apparatus to the disk drive apparatus indicating the selected one of the I/O interface mode and the memory card interface mode; and controlling the disk apparatus to transfer data between the disk drive apparatus and the host apparatus in accordance with the selected one of the I/O interface mode and the memory card interface mode indicated by the interface mode switching instruction.

5. A disk drive apparatus comprising:

a disk having a recording surface for storing data;

recording/reproducing means for at least one of recording data on the recording surface and reproducing data from the recording surface;

a housing enclosing at least the disk and the recording/reproducing means; and a connecting unit conforming to at least a memory card interface specification for transferring data between the disk drive apparatus and an external circuit;

wherein the connecting unit is operable in an I/O interface mode in which the connecting unit conforms to an I/O interface specification and the disk drive apparatus is used as a disk drive apparatus, and a memory card interface mode in which the connecting unit conforms to the memory card interface specification and the disk drive apparatus is used as a memory card;

wherein the connecting unit transfers data between the disk drive apparatus and an external circuit in accordance with a selected one of the I/O interface mode and the memory card interface mode; and wherein the disk drive apparatus further comprises storing means for storing interface mode identification information indicating which one of the I/O interface mode and the memory card interface mode is currently selected, the storing means storing the interface mode identification information in such a manner that the interface mode identification information can be read by the external circuit.

6. A disk drive apparatus comprising:

a disk having a recording surface for storing data;

recording/reproducing means for at least one of recording data on the recording surface and reproducing data from the recording surface;

a housing enclosing at least the disk and the recording/reproducing means; and a connecting unit conforming to at least a memory card interface specification for transferring data between the disk drive apparatus and an external circuit;

wherein the connecting unit is operable in an I/O interface mode in which the connecting unit conforms to an I/O interface specification and the disk drive apparatus is used as a disk drive apparatus, and a memory card interface mode in which the connecting unit conforms to the memory card interface specification and the disk drive apparatus is used as a memory card;

wherein the connecting unit transfers data between the disk drive apparatus and an external circuit in accordance with a selected one of the I/O interface mode and the memory card interface mode; and wherein the disk drive apparatus further comprises:

a terminal for receiving an interface mode switching signal indicating which one of the I/O interface mode and the memory card interface mode is to be selected; and means, responsive to the interface mode switching signal, for controlling the connecting unit to transfer data between the disk drive apparatus and the external circuit in accordance with the selected one of the I/O interface mode and the memory card interface mode indicated by the interface mode switching signal.

7. A method of connecting a disk drive apparatus to an external circuit, the method comprising the steps of:

providing the disk drive apparatus with a connecting unit operable in an I/O interface mode in which the connecting unit conforms to an I/O interface specification and the disk drive apparatus is used as a disk drive apparatus, and a memory card interface mode in which the connecting unit conforms to a memory card interface specification and the disk drive apparatus is used as a memory card;

providing the external circuit with a terminal unit conforming to a selected one of the I/O interface specification and the memory card interface specification; and connecting the connecting unit with the terminal unit to connect the disk drive apparatus to the external circuit;

wherein the connecting unit transfers address signals, data signals, and control signals between the disk drive apparatus and the external circuit via the terminal unit in accordance with the selected one of the I/O interface mode and the memory card interface mode, and receives electric power from the external circuit via the terminal unit.

8. A method of connecting a disk drive apparatus to an external circuit according to claim 7, wherein the connecting unit includes:

address lines, data lines, and control lines for transferring the address signals, the data signals, and the control signals between the disk drive apparatus and the external circuit via the terminal unit;

at least one power supply line for receiving the electric power from the external circuit via the terminal unit; and at least one ground line.

9. A method of connecting a disk drive apparatus to an external circuit according to claim 7, wherein the step of connecting the connecting unit with the terminal unit includes the step of connecting the connecting unit with the terminal unit using a microtribeam mounting method.

10. A method of connecting a disk drive apparatus to an external circuit according to claim 7, wherein the step of connecting the connecting unit with the terminal unit includes the step of connecting the connecting unit with the terminal unit using a multi-contact rotary connecting method.

11. A method of connecting a disk drive apparatus to an external circuit according to claim 7, wherein the disk drive apparatus includes a disk having a recording surface for storing data;

wherein the step of providing the disk drive apparatus with a connecting unit includes the step of attaching the connecting unit to the disk drive apparatus such that the connecting unit can be inserted into the terminal unit in a direction extending parallel to the recording surface; and wherein the step of connecting the connecting unit with the terminal unit includes the step of directly inserting the connecting unit into the terminal unit to mount the disk drive apparatus on the terminal unit.

12. A method of connecting a disk drive apparatus to an external circuit according to claim 11, wherein the disk drive apparatus further includes a housing having a short side and a long side, the housing enclosing at least the disk; and wherein the step of attaching the connecting unit to the disk drive apparatus includes attaching the connecting unit to the disk drive apparatus such that the connecting unit can be inserted into the terminal unit in a direction extending parallel to the long side of the housing.

13. A method of connecting a disk drive apparatus to an external circuit according to claim 7, wherein the connecting unit receives an interface mode switching signal for selecting one of the I/O interface mode and the memory card interface mode from the external circuit via the terminal unit.

14. A method of connecting a disk drive apparatus to an information processing apparatus, the information processing apparatus including a CPU, a memory, a terminal unit, and a system bus connecting the CPU, the memory, and the terminal unit to one other, the terminal unit conforming to a selected one of an I/O interface specification and a memory card interface specification, the method comprising the steps of:

providing the disk drive apparatus with a connecting unit operable in an I/O interface mode in which the connecting unit conforms to the I/O interface specification and the disk drive apparatus is used as a disk drive apparatus, and a memory card interface mode in which the connecting unit conforms to the memory card interface specification and the disk drive apparatus is used as a memory card; and connecting the connecting unit with the terminal unit to connect the disk drive apparatus to the information processing apparatus;

wherein the connecting unit transfers address signals, data signals, and control signals between the disk drive apparatus and the system bus of the information processing apparatus via the terminal unit in accordance with the selected one of the I/O interface mode and the memory card interface mode, and receives electric power from the system bus of the information processing apparatus via the terminal unit.

15. A disk drive apparatus comprising:

a disk having a recording surface for storing data;

recording/reproducing means for at least one of recording data on the recording surface and reproducing data from the recording surface;

a housing enclosing at least the disk and the recording/reproducing means; and a connecting unit, operable in an I/O interface mode in which the connecting unit conforms to an I/O interface specification and the disk drive apparatus is used as a disk drive apparatus, and a memory card interface mode in which the connecting unit conforms to a memory card interface specification and in the disk drive apparatus is used as a memory card, for transferring data between the disk drive apparatus and an external circuit in accordance with a selected one of the I/O interface mode and the memory card interface mode.

16. A disk drive apparatus according to claim 5, wherein the disk drive apparatus further comprises storing means for storing interface mode identification information indicating which one of the I/O interface mode and the memory card interface mode is currently selected, the storing means storing the interface mode identification information in such a manner that the interface mode identification information can be read by the external circuit.

17. A disk drive apparatus according to claim 15, wherein the disk drive apparatus further comprises:

a terminal for receiving an interface mode switching signal indicating which one of the I/O interface mode and the memory card interface mode is to be selected; and control means, responsive to the interface mode switching signal, for controlling the connecting unit to transfer data between the disk drive apparatus and the external circuit in accordance with the one of the I/O interface mode and the memory card interface mode indicated by the interface mode switching signal.

18. A disk drive apparatus according to claim 15, wherein the connecting unit is adapted to be connected to the external circuit using a microtribeam mounting method.

19. A disk drive apparatus according to claim 15, wherein the connecting unit is adapted to be connected to the external circuit using a multi-contact rotary connecting method.

20. A disk drive apparatus comprising:

a disk having a recording surface for storing data;

recording/reproducing means for at least one of recording data on the recording surface and reproducing data from the recording surface;

a housing enclosing at least the disk and the recording/reproducing means; and a connecting unit conforming to at least a memory card interface specification for transferring data between the disk drive apparatus and an external circuit.

21. A disk drive apparatus according to claim 20, wherein the connecting unit conforms to the memory card interface specification and an I/O interface specification.

* * * * *